US012648335B2

(12) United States Patent
Kim et al.

(10) Patent No.: US 12,648,335 B2
(45) Date of Patent: Jun. 2, 2026

(54) LIGHT EMITTING DISPLAY DEVICE

(71) Applicant: LG DISPLAY CO., LTD., Seoul (KR)

(72) Inventors: Ho Sung Kim, Paju-si (KR); In Seop Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 384 days.

(21) Appl. No.: 18/218,460

(22) Filed: Jul. 5, 2023

(65) Prior Publication Data

US 2024/0016031 A1     Jan. 11, 2024

(30) Foreign Application Priority Data

Jul. 5, 2022    (KR) ........................ 10-2022-0082752

(51) Int. Cl.
H10K 59/12       (2023.01)
H10K 59/122      (2023.01)
H10K 59/80       (2023.01)
(52) U.S. Cl.
CPC ..... H10K 59/80521 (2023.02); H10K 59/122 (2023.02)
(58) Field of Classification Search
CPC .................................................... H10K 59/12
USPC ................................................. 313/498–512
See application file for complete search history.

(56) References Cited

U.S. PATENT DOCUMENTS

| | | | |
|---|---|---|---|
| 2016/0155978 A1* | 6/2016 | Park | H10K 50/15 |
| | | | 438/46 |
| 2019/0181368 A1* | 6/2019 | Kim | H10K 59/124 |
| 2021/0202536 A1* | 7/2021 | Lee | H10K 50/171 |
| 2022/0208876 A1* | 6/2022 | Park | H10K 50/19 |
| 2022/0209172 A1* | 6/2022 | Jeon | H10K 50/156 |
| 2023/0371334 A1* | 11/2023 | Levermore | H10K 59/32 |
| 2024/0224623 A1* | 7/2024 | Lim | H10K 59/124 |
| 2024/0260410 A1* | 8/2024 | Kim | H10K 71/00 |
| 2025/0056966 A1* | 2/2025 | Im | H10K 85/622 |

FOREIGN PATENT DOCUMENTS

| | | |
|---|---|---|
| KR | 10-2016-0072010 A | 6/2016 |
| KR | 10-2016-0066234 A | 8/2016 |
| KR | 10-2018-0061948 A | 6/2018 |
| KR | 10-2020-0001655 A | 1/2020 |

* cited by examiner

*Primary Examiner* — Christopher M Raabe
(74) *Attorney, Agent, or Firm* — Birch, Stewart, Kolasch & Birch, LLP

(57)              ABSTRACT
A light emitting display device can include a plurality of light emitting portions disposed on a substrate and a non-light emitting portion between the light emitting portions; first electrodes respectively disposed at the plurality of light emitting portions, the first electrodes being spaced apart from each other; a first stack, a charge generation layer and a second stack disposed on the first electrodes, the charge generation layer being disposed between the first stack and the second stack; and a second electrode disposed on the second stack. Also, the second electrode is connected to the first charge generation layer through a connection portion at the non-light emitting portion.

20 Claims, 24 Drawing Sheets

D1

D2

D3

D4

LIGHT EMITTING DISPLAY DEVICE

CROSS REFERENCE TO RELATED APPLICATION

This application claims priority under 35 U.S.C. § 119(a) to Korean Patent Application No. 10-2022-0082752, filed in the Republic of Korea on Jul. 5, 2022, the entirety of which is hereby incorporated by reference as if fully set forth herein into the present application.

BACKGROUND

Field of the Invention

The disclosure relates to a display device, and more particularly, to a light emitting display device that reduces a lateral leakage current and improves luminance character-istics in a structure of multiple stacks through a connection between a cathode and a part of a charge generation layer.

Discussion of the Related Art

With the advent of the information society, displays for visually expressing electrical information signals have developed rapidly. In response to this, a variety of display devices with excellent performance such as slimness, low weight, and low power consumption are developed.

Among display devices, a light emitting display device that does not require a separate light source to realize compactness, vivid colors, and has a light emitting element in a display panel has been considered as a competitive application.

The light emitting element can include an anode and a cathode facing each other as electrodes, a light emitting layer between the anode and the cathode, and a common layer for transferring holes and electrons to the light emitting layer.

The common layer is formed over a plurality of sub-pixels and can cause generation of lateral leakage current between sub-pixels due to the common layer in the light emitting display device, which can impair image quality and con-sume more power. Also, sub-pixels that include multiple stacks can experience a significant change in luminance when the temperature changes, which can impair image quality.

SUMMARY OF THE DISCLOSURE

The disclosure is directed to a light emitting display device that substantially obviates one or more problems due to the limitations and disadvantages of the related art.

It is an object of the present disclosure to provide an improved light emitting display device capable of prevent-ing or reducing lateral leakage current and ensuring unifor-mity of luminance characteristics during changes in tem-perature based on the connection between a part of a common layer and a cathode.

Additional advantages, objects, and features of the dis-closure will be set forth in part in the description which follows and in part will become apparent to those having ordinary skill in the art upon examination of the following, or can be learned from practice of the disclosure. The objectives and other advantages of the disclosure can be realized and attained by the structure particularly pointed out in the written description and claims hereof as well as the appended drawings.

The light emitting display device of the present disclosure includes a connection portion between a cathode and one layer of an internal stack at a non-light emitting portion between light emitting portions for emitting different colors of light to prevent lateral leakage current, to reduce resis-tance of the multi-layered stack and to thereby minimize luminance variation depending on temperature change.

A light emitting display device according to an example embodiment of the present disclosure can include a substrate having a plurality of light emitting portions and a non-light emitting portion between the light emitting portions, first electrodes at the respective light emitting portions and spaced apart from each other, a first stack, a first charge generation layer and a second stack on the first electrodes, the first charge generation layer positioned between the first stack and the second stack and a second electrode on the second stack, the second electrode electrically connected through a connection portion to the first charge generation layer at the non-light emitting portion.

In addition, a light emitting display device according to an embodiment of the present disclosure can include a substrate including a first light emitting portion and a second light emitting portion spaced apart from the first light emitting portion, a first anode and a second anode at the first light emitting portion and the second light emitting portion, respectively, a first stack, a charge generation layer and a second stack provided on the first anode and the second anode, a cathode on the second stack, and a connection portion connecting the cathode to the charge generation layer between the first light emitting portion and the second light emitting portion.

It is to be understood that both the foregoing general description and the following detailed description of the disclosure are explanatory and are intended to provide further explanation of the disclosure as claimed.

BRIEF DESCRIPTION OF THE DRAWINGS

The accompanying drawings, which are included to pro-vide a further understanding of the disclosure and are incorporated in and constitute a part of this application, illustrate embodiment(s) of the disclosure and together with the description serve to explain the principle of the disclo-sure. In the drawings.

DETAILED DESCRIPTION OF THE EMBODIMENTS

Figure 1:
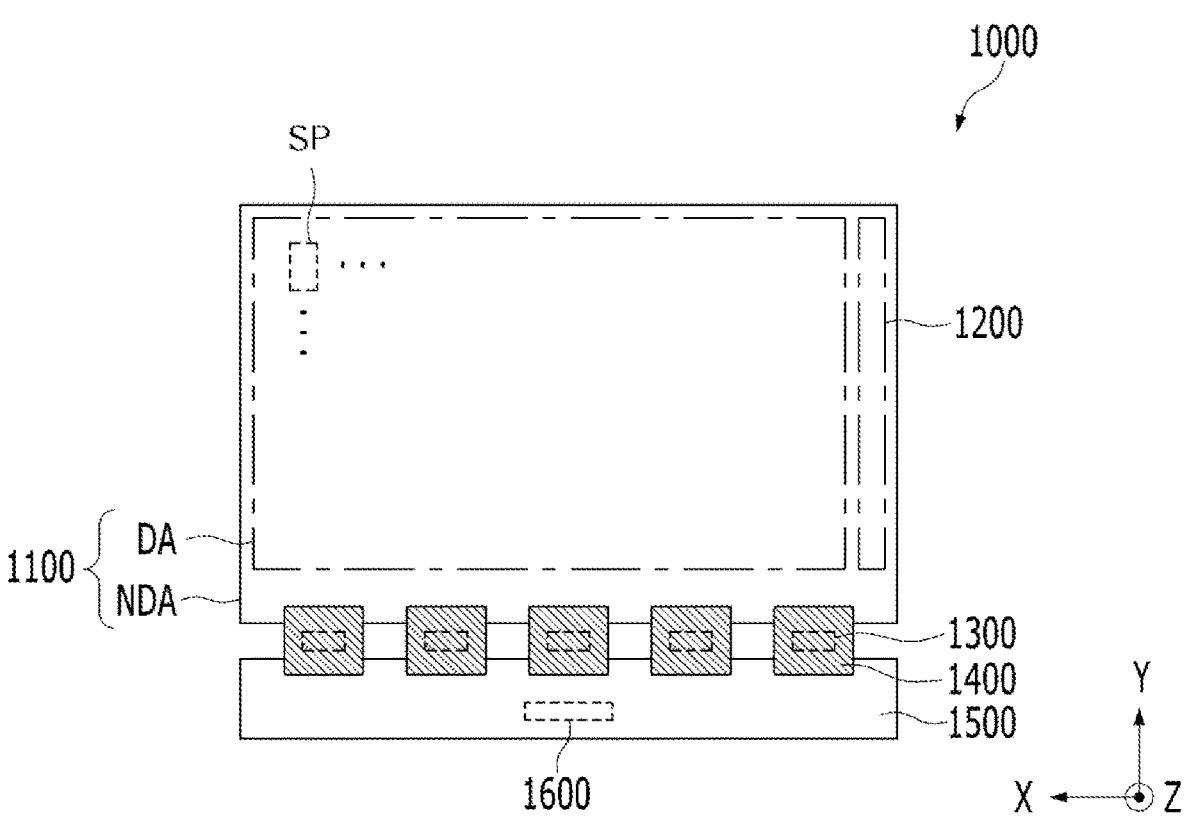
FIG. 1 is a plan view illustrating a configuration of a light emitting display device according to an example embodi-ment of the present disclosure.

Reference will now be made in detail to example embodiments of the present disclosure, examples of which are illustrated in the accompanying drawings. Wherever possible, the same reference numbers will be used throughout the drawings to refer to the same or like parts, unless otherwise specified.

Advantages and features of the present disclosure, and a method of achieving the advantages and features will become apparent with reference to the example embodiments described herein in detail together with the accompanying drawings. The present disclosure should not be construed as limited to the example embodiments as disclosed below, and can be embodied in various different forms. Thus, these example embodiments are set forth only to make the present disclosure sufficiently complete, and to assist those skilled in the art to fully understand the scope of the present disclosure. The protected scope of the present disclosure is defined by the claims and their equivalents.

In the following description of the present disclosure, where the detailed description of the relevant known steps, elements, functions, technologies, and configurations can unnecessarily obscure an important point of the present disclosure, a detailed description of such steps, elements, functions, technologies, and configurations can be omitted. In addition, the names of elements used in the following description are selected in consideration of clarity of description of the specification, and can differ from the names of elements of actual products. Furthermore, in the following detailed description of the present disclosure, numerous specific details are set forth in order to provide a sufficiently thorough understanding of the present disclosure. However, it will be understood that the present disclosure can be practiced without these specific details. In other instances, known methods, procedures, components, and circuits have not been described in detail so as not to unnecessarily obscure aspects of the present disclosure.

The shapes, sizes, ratios, angles, numbers, and the like, which are illustrated in the drawings to describe various example embodiments of the present disclosure are merely given by way of example. The disclosure is not limited to the illustrations in the drawings.

In the present specification, where terms such as "including," "having," "comprising," and the like are used, one or more components can be added, unless the term, such as "only," is used. As used herein, the term "and/or" includes a single associated listed item and any and all of the combinations of two or more of the associated listed items.

An expression such as "at least one of" when preceding a list of elements can modify the entire list of elements and may not modify the individual elements of the list. The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The terminology used herein is to describe particular aspects and is not intended to limit the present disclosure. As used herein, the terms "a" and "an" used to describe an element in the singular form is intended to include a plurality of elements. An element described in the singular form is intended to include a plurality of elements, and vice versa, unless the context clearly indicates otherwise.

In construing a component or numerical value, the component or the numerical value is to be construed as including an error or tolerance range even where no explicit description of such an error or tolerance range is provided.

In describing the various example embodiments of the present disclosure, where the positional relationship between two elements is described using terms, such as "on," "above," "under" and "next to," at least one intervening element can be present between the two elements, unless "immediate(ly)" or "direct(ly)" or "close(ly) is used. It will be understood that when an element or layer is referred to as being "connected to," or "coupled to" another element or layer, it can be directly connected to or coupled to the other element or layer, or one or more intervening elements or layers can be present.

In describing the various example embodiments of the present disclosure, when terms such as "after," "subsequently," "next," and "before," are used to describe the temporal relationship between two events, another event can occur therebetween, unless a more limiting term, such as "just," "immediate(ly)," or "directly" is used.

In describing the various example embodiments of the present disclosure, terms such as "first" and "second" can be used to describe a variety of components. These terms aim to distinguish the same or similar components from one another and do not limit the components. Accordingly, throughout the specification, a "first" component can be the same as a "second" component within the technical concept of the present disclosure, unless specifically mentioned otherwise.

Features of various embodiments of the present disclosure can be partially or overall coupled to or combined with each other, and can be variously inter-operated with each other and driven technically as those skilled in the art can suffi- ciently understand. The embodiments of the present disclo- sure can be carried out independently from each other, or can be carried out together in a co-dependent relationship.

Hereinafter, a light emitting display device and a method of manufacturing the same will be described with reference to the annexed drawings.

Figure 2:
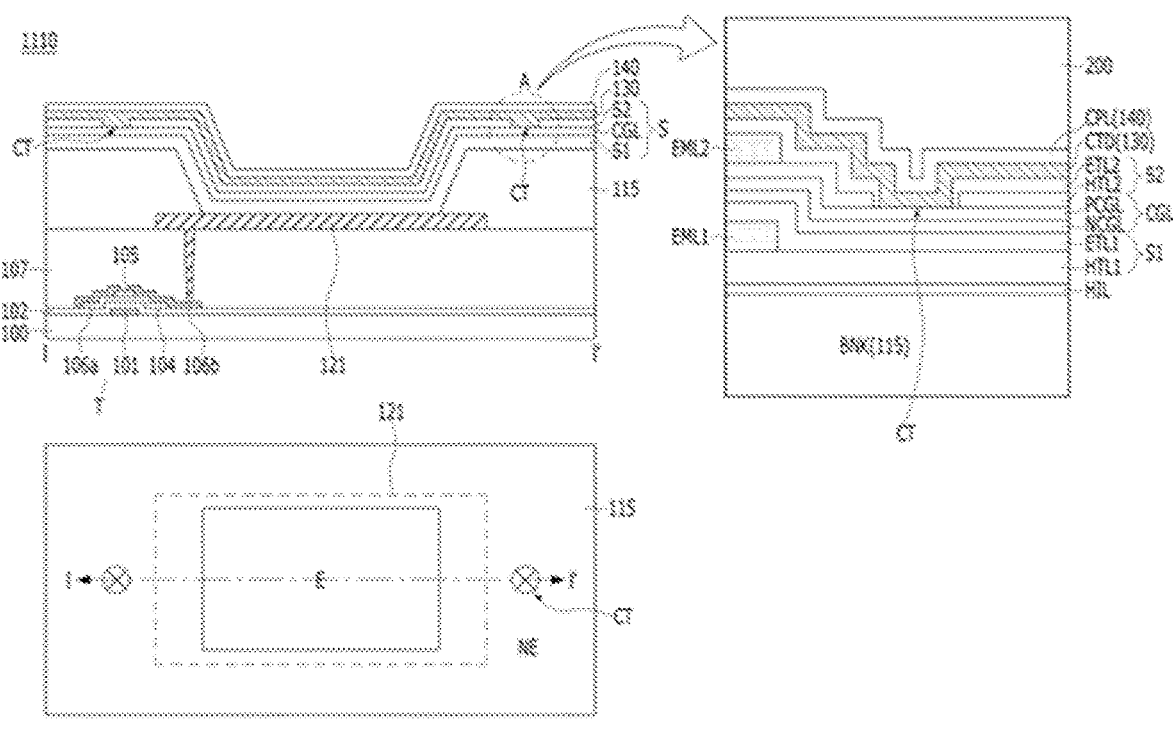
FIG. 2 is a plan view and a cross-sectional view illustrat-ing the sub-pixel of FIG. 1 according to an embodiment of the present disclosure.

FIG. 1 is a plan view illustrating a configuration of a light emitting display device according to an example embodi- ment of the present disclosure. FIG. 2 is a plan view and a cross-sectional view illustrating the sub-pixel of FIG. 1.

As shown in FIGS. 1 and 2, the light emitting display device 1000 of the present disclosure can include a display panel 1100, a scan driver 1200, a flexible film 1400 includ- ing a data driver, a circuit board 1500, and a timing con- troller 1600. The flexible film 1400 can include a drive IC 1300 to function as a data driver. As shown in the drawing, the flexible film 1400 can supply data signals through a plurality of signal lines included in the display panel 1100 divided into several blocks, can detect sensing signals, or can function as a data driver through the flexible film 1400 disposed corresponding to all signal lines. In some situa- tions, the flexible film 1400 can be integrated with the circuit board 1500.

The display panel 1100 can include an array on a single substrate (see 100 in FIG. 2) or can have a configuration in which a substrate 100 having an array and a counter sub- strate that face each other are bonded to each other.

The substrate 100 and the counter substrate can include glass or plastic substrates. An element such as a thin film transistor array, a color filter array, or an optical film can be further included on the substrate 100. For example, when the substrate 100 and/or the counter substrate includes a sub- strate formed of a plastic, the plastic constituting the sub- strate can be polyimide, polyethylene terephthalate (PET), polyethylene naphthalate (PEN), or polycarbonate (PC). When the substrate 100 includes a substrate formed of a plastic, the light emitting display device 1000 can be imple- mented as a flexible display device that is bendable or flexible. The counter substrate can include glass, a plastic film, or an encapsulation film. When the counter substrate is an encapsulation film, the encapsulation film can have a unit structure including organic and inorganic films alternately stacked and can be formed directly on the substrate 100 without a process of bonding to the substrate 100 including an array.

The substrate 100 is a thin film transistor substrate on which thin film transistors are formed.

A plurality of scan lines, a plurality of signal lines, and a plurality of sub-pixels SP are formed on one surface of the substrate 100. The sub-pixels SP can be provided in areas defined by intersections between the scan lines and the signal lines. Each of the scan lines is connected to the scan driver 1200 and the signal lines are connected to the data driver. In addition, as shown in the drawing, the scan driver 1200 can be directly embedded in a non-display area NDA of an array substrate 1110, or can be connected to the non-display area NDA on the array substrate 1110 via a separate drive IC or a printed circuit film.

As shown in FIG. 1, the display panel 1100 can be divided into a display area DA, in which sub-pixels SP are provided to display an image, and a non-display area NDA surround- ing the display area DA. Scan lines, signal lines, and sub-pixels SP can be formed in the display area DA. The scan driver 1200, pads, signal lines, and link lines connect- ing the pads can be formed in the non-display area NDA.

The sub-pixel SP can include a light emitting portion E, where light is emitted, and a non-light emitting portion NE outside the light emitting portion. As shown in FIG. 2, the light emitting portion E can be provided in an area where the bank 115 is not formed.

In addition, the sub-pixel SP can include at least one thin film transistor.

FIG. 2 illustrates a sub-pixel of FIG. 1 and includes a plan view and a cross-sectional view illustrating the entire area of the sub-pixel SP at the left, and an enlarged cross-sectional view illustrating a portion corresponding to the connection portion CT at the right.

As shown in FIGS. 1 and 2, the light emitting display device according to an embodiment includes a substrate 100 having a plurality of light emitting portions E and a non-light emitting portion NE between the light emitting portions E, first electrodes 121 provided at the respective light emitting portions and spaced apart from each other, a first stack, a charge generation layer CGL and a second stack provided on the first electrodes, and a second electrode CTD 130 pro- vided on the second stack. and electrically connected to the charge generation layer CGL via a connection portion CT in the non-light emitting portion NE.

The first electrodes 121 are spaced apart from each other. The first electrodes 121 can be disposed at a wider region than the light emitting portions E (e.g., 121 can have a larger area than light emitting portion E).

The charge generation layer CGL is positioned between the first stack and the second stack.

The second electrode CTD 130 can be integrally formed over the plurality of light emitting portions E and the non-light emitting portion NE of the substrate 100. The second electrode CTD 130 may be not present at a part of non-emitting portion NE. The second electrode CTD 130 is connected to the charge generation layer CGL of the non- light emitting portion NE, so that the second stack S2 and the charge generation layer CGL can have a common potential with the second electrode CTD 130 in the non-light emitting portion NE. Accordingly, it is possible to prevent the gen- eration of lateral leakage current caused from the charge generation layer CGL and the common layer formed over the light emitting portions E and the non-light emitting portion NE in the second stack S2.

The display device can emit light of different colors from adjacent light emitting portions E and the light emitting colors emitted from the light emitting portions E can be controlled by adjusting light emitting wavelength regions by changing the components of the host and dopant of the light emitting layers EML1 and EML2 in the first and second stacks S1 and S2. For example, the light emitting layers EML1 and EML2 included in the first and second stacks S1 and S2 overlapping with each other in one light emitting portion E can emit light of the same color. When, around a light emitting portion including light emitting layers EML1 and EML2 emitting light of a first color, another light emitting portion having a light emitting layer emitting light of a second color different from the first color is provided, there is a difference in turn-on voltage between the light emitting portion emitting light of the first color and the light emitting portion emitting light of the second color. For example, the turn-on voltage of a light emitting portion emitting light having a short wavelength can be higher than that of a light emitting portion emitting light having a long wavelength. In this situation, when only the light emitting portion having a high turn-on voltage is selectively turned on in a low gradation, the adjacent light emitting portion having a low turn-on voltage can be weakly turned on due to the leakage current. The light emitting display device of the present disclosure includes a connection portion CT between the second electrode CTD 130 and the charge generation layer CGL between adjacent light emitting portions E, so that the charge generation layer CGL, the second stack S2 and the second electrode CTD 130 have the same potential when driving in a low gradation to prevent leakage of light from a light emitting portion having a low turn-on voltage even when a light emitting portion having a high turn-on voltage is selectively turned on.

The example illustrated in FIG. 2 shows a configuration in which a connection portion CT is provided in non-light emitting portions NE on both left and right sides that are spaced apart from one light emitting portion E, but is not limited thereto. The connection portion CT can be disposed on both of the top and bottom of the light emitting portion E, or can be provided on all of the left, right, top and bottom (e.g., in a closed loop shape surrounding the light emitting portion E). In addition, more preferably, the connection portion CT is disposed in the non-light emitting portion NE between light emitting portions E emitting light of different colors because leakage of light due to lateral leakage current can be effectively prevented.

While the light emitting portions E are defined by openings of a bank BNK 115 and are spaced apart from each other, the non-light emitting portions NE fill the gaps between the light emitting portions E and are connected to each other in the form of a matrix. The non-light emitting portions NE can be integrated with each other on the substrate 100. In addition, the non-light emitting portion NE can correspond to the area where the bank BNK 115 is formed.

The first electrode 121 and the second electrode CTD 130 are also referred to as an "anode" and a "cathode", respectively. In some situations, the first electrode 121 is separately formed in each sub-pixel SP, whereas the second electrode CTD 130 is formed in common with the sub-pixels SP provided on the substrate 100 and thus is also called "common electrode". The first electrode 121 is connected to the thin film transistor and can thus be selectively driven in each sub-pixel, and a constant voltage or ground voltage is applied to the second electrode CTD 130.

In the light emitting display device of the present disclosure, the second electrode CTD 130 is connected to the charge generation layer CGL in the connection portion CT, to make the potential of the charge generation layer CGL and the second stack S2 in the non-light emitting portion the same as the common voltage applied to the second electrode CTD 130.

The first electrode 121, the first stack S1, the charge generation layer CGL, the second stack S2, and the second electrode CTD 130 are provided in each light emitting portion E. The entire stack S (e.g., S1, CGL and S2) between the first electrode 121 and the second electrode 130 can be formed of an organic material.

A hole injection layer HIL, a first hole transport layer HTL1, a first light emitting layer EML1, and a first electron transport layer ETL1 can be sequentially formed in the first stack S1, and a second hole transport layer HTL2, a second light emitting layer EML2, and a second electron transport layer ETL2 can be provided in the second stack S2.

The entire stack S including the first stack S1, the charge generation layer CGL, and the second stack S2 between the first electrode 121 and the second electrode 130 can include organic layers containing an organic compound as a base component and can include an inorganic material in a part of the organic layers for light emission characteristics and hole and electron transport characteristics. In some situations, the entire stack S including the first stack S1, the charge generation layer CGL, and the second stack S2 can further include an inorganic layer containing an inorganic compound.

The hole injection layer HIL, and the first and second hole transport layers HTL1 and HTL2 are disposed under the first and second light emitting layers EML1 and EML2 in each stack S1 and S2 and perform hole injection and hole transport functions. Specifically, the hole injection layer HIL functions to inject holes into the stack toward the second electrode 130 from the first electrode 121. The first and second hole transport layers HTL1 and HTL2 are provided to transport holes supplied from the hole injection layer HIL and the charge generation layer CGL to the first and second light emitting layers EML1 and EML2.

The first and second electron transport layers ETL1 and ETL2 are disposed on the first and second light emitting layers EML1 and EML2, respectively, and function to transport electrons. Specifically, the first and second electron transport layers ETL1 and ETL2 transport electrons supplied from the charge generation layer CGL and the second electrode CTD 130 to the first and second light emitting layers EML1 and EML2.

In some situations, at least one of the hole injection layer HIL, the first and second hole transport layers HTL1 and HTL2, the first and second light emitting layers EML1 and EML2, and the first and second electron transport layers ETL1 and ETL2 can have a multilayer structure.

In addition, as shown in FIG. 2, the first and second light emitting layers EML1 and EML2 may not be formed in a part of the non-light emitting portion NE. The edges of the first and second light emitting layers EML1 and EML2 can be disposed in the non-light emitting portion NE and the first and second light emitting layers EML1 and EML2 can have a larger area than the light emitting portion E. When light emitting layers emitting light of different colors in the respective light emitting portions E are provided, the first and second light emitting layers EML1 and EML2 can be formed through a fine metal mask. The fine metal mask has an opening corresponding to each light emitting portion and the size of the opening can be reduced as resolution increases. Since the first and second light emitting layers EML1 and EML2 should be sufficiently formed in the light emitting portion E exposed by the bank 115, it is necessary to form an opening in consideration of the alignment margin or scan alignment margin of the fine metal mask in the deposition process.

In addition, an electron injection layer can be further included between the second stack S2 and the second electrode 140. The electron injection layer can be included inside the second stack S2.

The electron injection layer can include an inorganic compound including a metal or halide to improve characteristics of the interface with the second electrode CTD 130 or improve reliability in a certain environment. When the electron injection layer is formed of an inorganic material or an inorganic compound, the second electrode CTD 130 can be formed in a plurality of layers and the lower layer can be used.

The first stack S1, the charge generation layer CGL, and the second stack S2 included in the entire stack S provided between the first electrode 121 and the second electrode CTD 130 can be organic layers containing an organic compound as a main component.

One of the first electrode 121 and the second electrode CTD 130 can include a reflective electrode, and the other can include a transparent electrode or a transflective electrode. The transparent electrode can include at least one of indium tin oxide (ITO), indium zinc oxide (IZO), and indium tin zinc oxide (ITZO). The reflective electrode can be formed of a reflective metal such as aluminum (Al), silver (Ag), magnesium (Mg), or ytterbium (Yb) or a reflective alloy including at least one reflective metal. The transflective electrode can be imparted with both transmittance and reflectivity by reducing the thickness of the reflective electrode.

Depending on which side of the first electrode 121 and the second electrode CTD 130 includes the reflective electrode, light can be emitted to the opposite side of the reflective electrode, and the emission direction can be determined. In some situations, when both the first electrode 121 and the second electrode CTD 130 include a transparent electrode, the light emitting display device can function as a transparent light emitting display device.

When a reflective electrode is included on either side of the first electrode 121 or the second electrode 130, the reflective electrode is formed in a stack structure in which the reflective electrode contacts the transparent electrode, to adjust the resonance distance of light emitted from each sub-pixel or adjust the interface characteristics between the first electrode 121 and the second electrode CTD 130 and the inner organic layer adjacent thereto.

A capping layer CPL 140 is provided on the second electrode CTD 130 to increase the emission efficiency of light emitted from the first and second light emitting layers EML1 and EML2 and to protect the second electrode CTD 130 and the internal organic layer. The capping layer CPL 140 can be formed of an inorganic compound or an organic compound having a refractive index similar to that of the organic layer between the first electrode 121 and the second electrode CTD 130.

In addition, in the light emitting display device according to an embodiment, as shown in FIG. 2, the connection portion CT can pass through the second hole transport layer HTL2 and the second electron transport layer ETL2 of the second stack S2, and the second electrode CTD 130 can be directly connected to the charge generation layer CGL through the connection portion CT. For example, a hole can extend all the way through the second hole transport layer HTL2 and the second electron transport layer ETL2, and a portion of the second electrode CTD 130 can directly contact an upper surface of the charge generation layer CGL via the hole. The width of the connection portion CT can have any of various shapes and widths as long as it does not invade the light emitting portion E.

The charge generation layer CGL can include an n-type charge generation layer NCGL close to the first stack S1 and a p-type charge generation layer PCGL close to the second stack S2. The n-type charge generation layer NCGL supplies electrons to the first stack S1 and the p-type charge generation layer PCGL supplies holes to the second stack S2.

In FIG. 2, the connection portion CT is formed by removing portions of the common layer of the second stack S2 from the layered structure. The common layer of the second stack S2 includes a second hole transport layer HTL2 and a second electron transport layer ETL2. In some situations, the second stack S2 can further include an electron blocking layer between the second hole transport layer HTL2 and the second light emitting layer EML2 and/or a hole blocking layer between the second light emitting layer EML2 and the second electron transport layer ETL2. The common layer added in the second stack S2 has a removal portion in an area corresponding to the connection portion CT, to directly connect the charge generation layer CGL to the second electrode CTD 130.

Further, the connection portion CT can be removed from the common layer after formation of the common layer and the common layer can be deposited through a fine metal mask having a blocking portion corresponding to the connection portion. That is, in the deposition process, a fine metal mask having a blocking portion corresponding to the connecting portion and an opening in the remaining area is prepared, and a common layer-forming material is deposited through the opening of the fine metal mask, such that a common layer is formed in the remaining area excluding the portion corresponding to the connection portion. In the structure of FIG. 2, a fine metal mask can be used in a deposition process of each layer when forming the second hole transport layer HTL2 and the second electron transport layer ETL2 of the second stack S2. FIG. 2 shows that the second electron transport layer ETL2 is formed to cover the side of the second hole transport layer HTL2. This means that the second electron transport layer ETL2 has a smaller area of the connection portion than the second hole transport layer HTL2. This can be realized by which, when the second electron transport layer ETL2 is formed, the area of the blocking portion of the fine metal mask is relatively smaller than that of the second hole transport layer HTL2 and the opening is increased, to increase the deposition area, but is not limited thereto. When forming the second hole transport layer HTL2 and the second electron transport layer ETL2, the same connection portion CT can be provided by using the same fine metal mask or providing a configuration having the same opening and blocking portion.

As shown in FIG. 2, with respect to the common layers of the second stack S2, that is, the second hole transport layer HTL2 and the second electron transport layer ETL2, the second hole transport layer HTL2 and the second electron transport layer ETL2 present at the side of the connection portion can contact, at side surfaces thereof, the second electrode CTD 130 that is embedded into the connection portion CT due to non-formation of a deposition material in the connection portion CT. For example, side surfaces of the second electron transport layer ETL2 and/or side surface of the second hole transport layer HTL2 can be in direct contact with a sides surfaces of the second electrode CTD 130.

In some situations, when the charge generation layer CGL includes a double-layered structure of an n-type charge generation layer and a p-type charge generation layer, a portion of the p-type charge generation layer PCGL can be removed so that the connection portion CT can directly connect the second electrode CTD 130 to the n-type charge generation layer NCGL. For example, a hole can be formed to extend all the way through the p-type charge generation layer PCGL so that a lower portion of the second electrode CTD 130 can directly contact an upper portion of the n-type charge generation layer NCGL. In this situation, the p-type charge generation layer PCGL and the common layer of the second stack S2 are side-connected to the second electrode CTD 130 at the connection portion.

Meanwhile, the first electrode 121 of the light emitting portion E can be connected to the thin film transistor and turned on.

For example, as shown in FIG. 2, the thin film transistor has a gate electrode 101 on the substrate 100, a semiconductor layer 104 overlapping with the gate electrode 101 and including a channel in the portion thereof overlapping the gate electrode 101, and a source electrode 106*a* and a drain electrode 106*b* connected to both sides of the semiconductor layer 104. A gate insulating film 102 can be further provided between the gate electrode 101 and the semiconductor layer 104, and an interlayer insulating film 105 can be further provided between the channel of the semiconductor layer and the source/drain electrodes 106*a*/106*b*.

A planarization layer 107 can be further included between the first electrode 121 and the thin film transistor in an area excluding a contact hole where electrical connection to each other occurs. The first electrode 121 can be connected to the thin film transistor through the contact hole and can be provided on the planarization layer 107.

The thin film transistor described above is provided as an example and the configuration thereof is not limited to the structure of FIG. 2. In another example, the gate electrode 101 can be disposed above the semiconductor layer 104.

Meanwhile, as shown in FIG. 2, the connection portion CT can be provided in a part of the non-light emitting portion NE (e.g., at an outer periphery of the light emitting portion E). The location of the connection portion CT can correspond to a part of the top of the bank 115. The connection portion CT can be spaced apart from the light emitting portion E in the form of an island on a plane and disposed in the non-light emitting portion NE. Accordingly, the common layer of the second stack S2 can be disconnected at the non-light emitting portion NE in an area between adjacent light emitting portions E, thereby preventing leakage current from flowing due to the common layer.

The connection portion CT can be provided in each non-light emitting portion NE between the light emitting portions E. In addition, the connection portion CT can be provided in the non-light emitting portion NE around the light emitting portion emitting light of a specific color (e.g., only around blue sub-pixels, etc.). In some situations, a plurality of connection portions CT can be provided in a plurality of rows or columns spaced apart from each other between two adjacent light emitting portions E.

The reason for removing the common layer of the second stack S2 to provide the connection portion CT in the light emitting display device of the present disclosure is as follows.

A tandem structure in which a plurality of light emitting layers emitting light of the same color are present in a plurality of stacks has an advantage of increasing the efficiency of each light emitting layer.

However, the tandem structure includes each stack provided with common layers such as a hole transport layer and an electron transport layer, in addition to the light emitting layer, and the tandem structure has more than twice as many common layers as a single stack structure including a single light emitting layer between the anode and the cathode, and thus there is often a lot of internal resistance to current flow between the anode and the cathode. Meanwhile, the light emitting display device can be exposed to various environments and should have uniform reliability even when the temperature changes.

Table 1 below shows changes in luminance at a temperature from 15° C. to 35° C. in a single stack structure and a tandem structure. In the experiments of Table 1, both the single stack and the tandem structure did not have a connection portion between the second electrode (cathode) and another common layer.

TABLE 1

| Structure | Change in luminance at each temperature (change in luminance %/° C.) |
| --- | --- |
| Single stack | 1.53 |
| Tandem (including 2 stacks) | 2.37 |

As can be seen from Table 1, since the tandem structure has a large internal resistance between the first electrode and the second electrode, the change in internal luminance increases as the temperature changes. In other words, as it gets hotter, there is a bigger change in luminance for the tandem structure. This is because the tandem structure has an increased internal resistance in the vertical direction since it has more common layers compared to the single stack structure. That is, since the tandem structure in the organic layers located between the first and second electrodes has a great vertical resistance, a smaller reference current value than that of the single stack is supplied at an initial temperature of 15° C. in the tandem structure when current is supplied based on the constant voltage difference between the first electrode and the second electrode. Accordingly, the tandem structure has a smaller reference current value than the single stack structure. Accordingly, since the tandem structure has a smaller reference current than the single stack structure, the current fluctuation compared to the reference current when the temperature changes in the tandem structure is greater than the current fluctuation compared to the reference current upon the temperature change in the single stack structure. Accordingly, in the tandem structure, there is more luminance variation when the temperature changes, which can impair image quality and detract from a user's viewing experience.

The light emitting display device of the present disclosure has a configuration in which the charge generation layer provided between the first stack and the second stack is connected to the second electrode in the non-light emitting portion, so that the charge generation layer, the second stack, and the second electrode have a common potential in the non-light emitting portion, thereby blocking the cause of resistance increase due to the second stack, which can better prevent or reduce any change in luminance even when the temperature changes.

Hereinafter, changes in voltage and resistance characteristics under the same current conditions when each of a red light emitting element, a green light emitting element, and a blue light emitting element are applied to a single stack and a tandem structure (including two stacks) will be examined. In this experiment, the change of single stack and tandem structure without a connection portion was investigated.

Figure 3A:
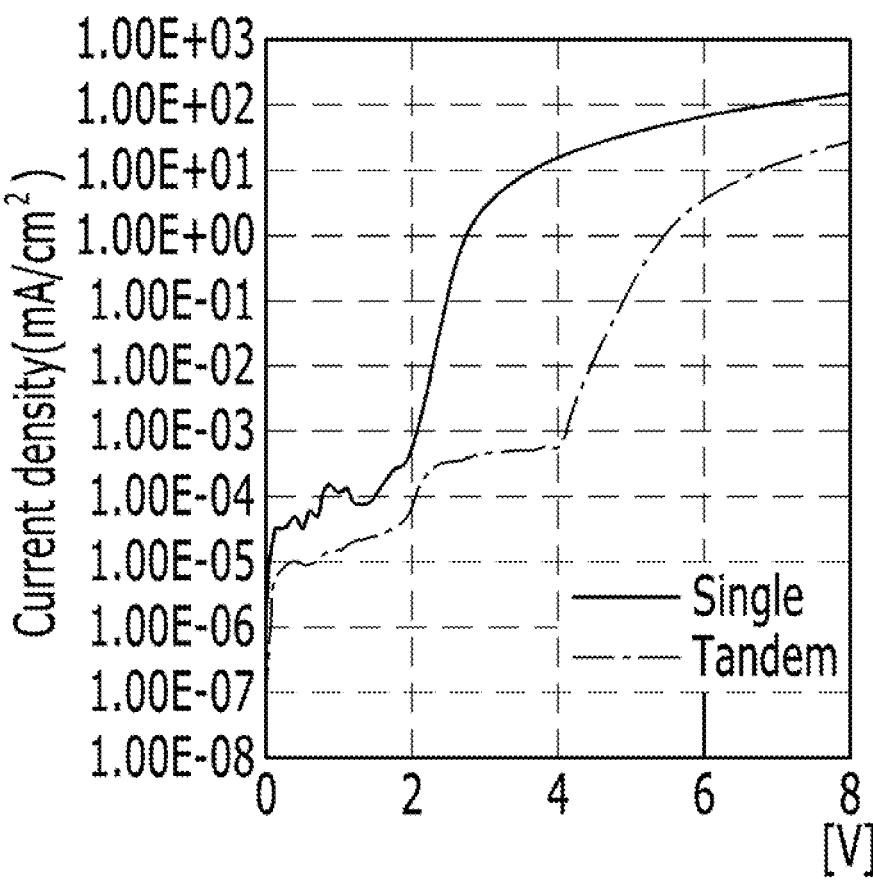
FIGS. 3A to 3C are graphs illustrating I-V characteristics when red, green, and blue light emitting elements are applied to a single stack and a tandem structure (including multiple stacks) according to an embodiment of the present disclosure.
Figure 3B:
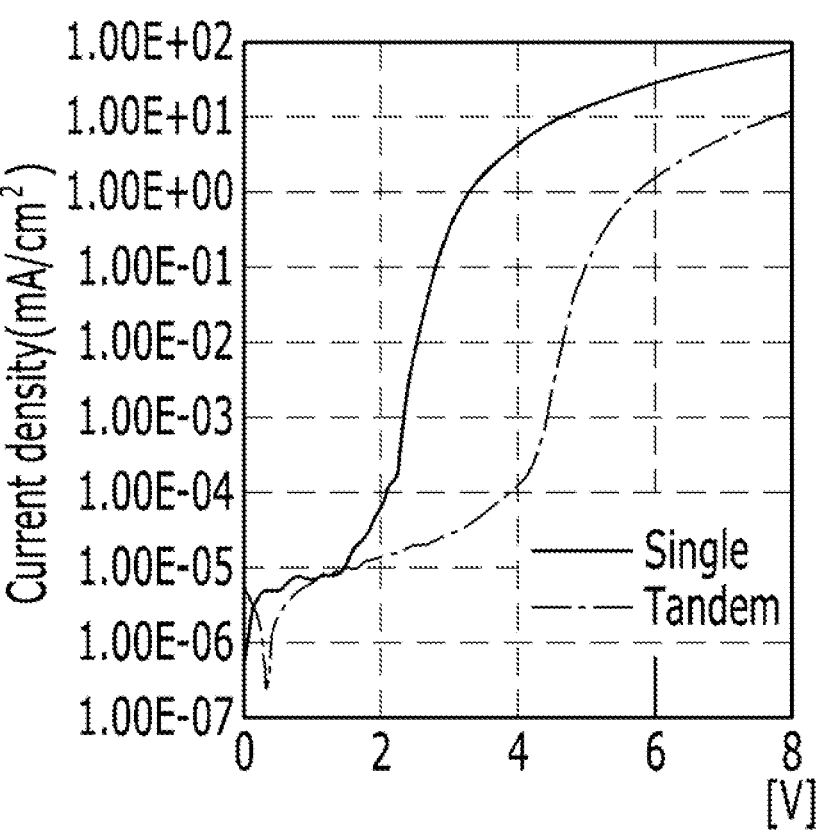
Figure 3C:
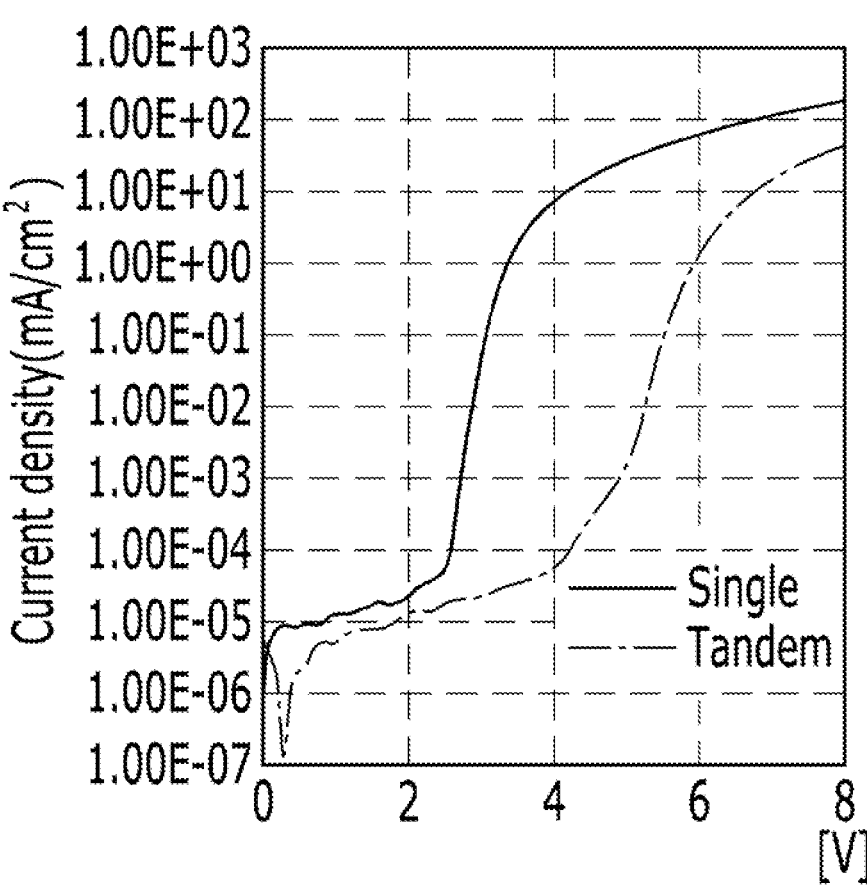

FIGS. 3A to 3C are graphs illustrating I-V characteristics when red, green, and blue light emitting elements, are applied to a single stack and a tandem structure (including multiple stacks).

As can be seen from FIGS. 3A to 3C, a driving voltage required for the tandem structure is higher than that of a single stack in order for all red, green, and blue light emitting elements to have the same current density.

Figure 4A:
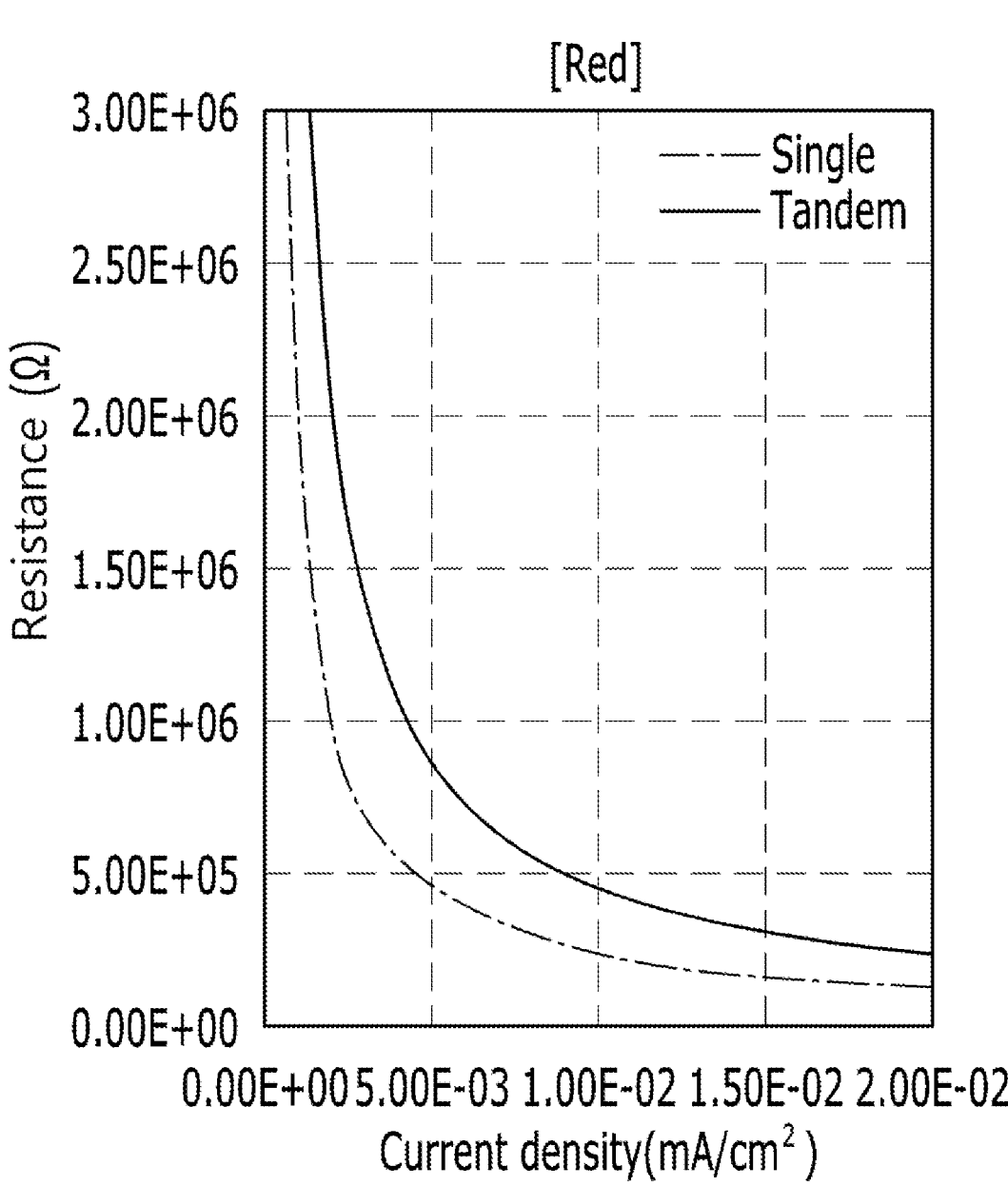
FIGS. 4A to 4C are graphs showing the relationship between current density and resistance when red, green, and blue light emitting elements are applied to a single stack and a tandem structure (including multiple stacks) according to an embodiment of the present disclosure.
Figure 4B:
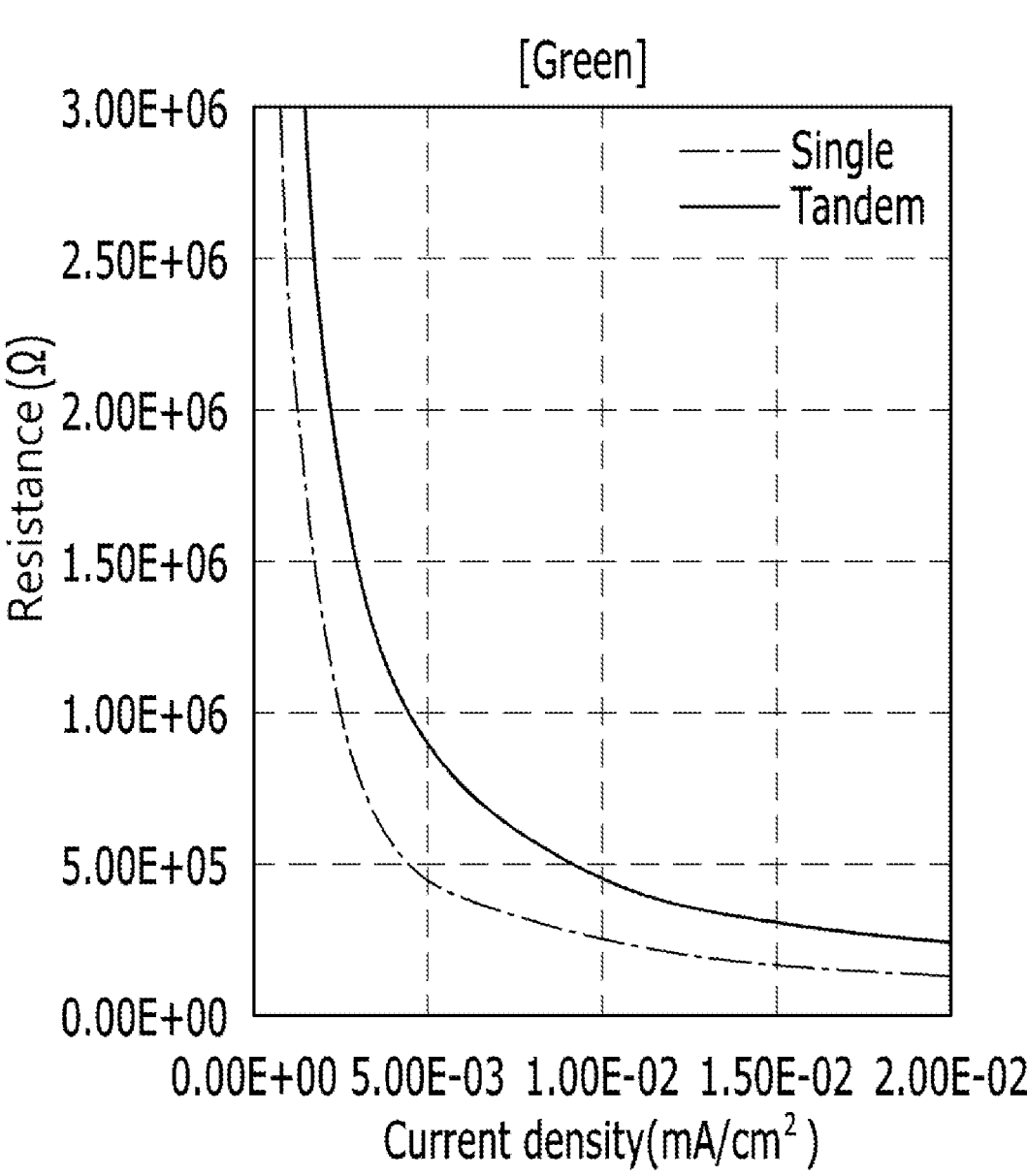
Figure 4C:
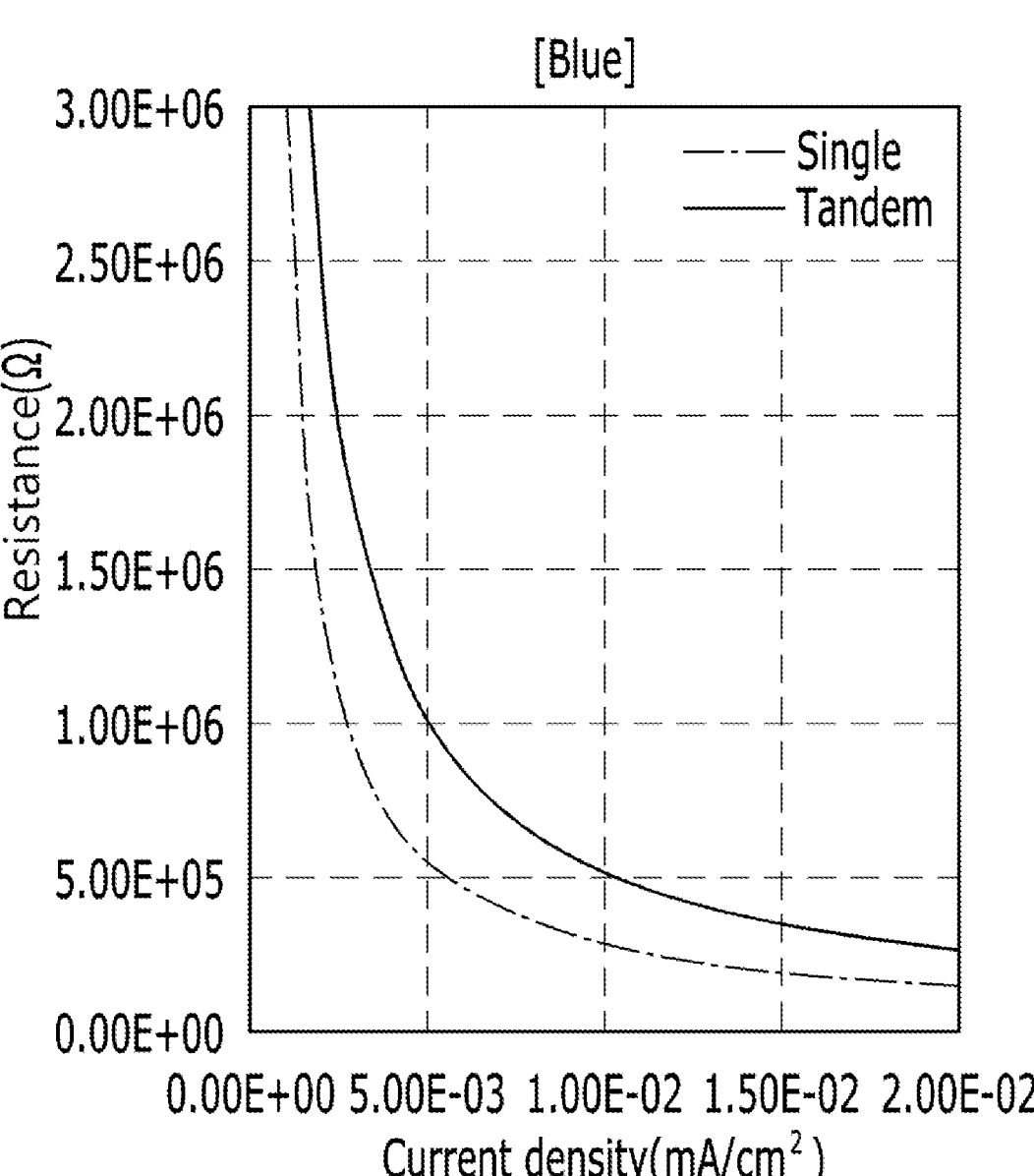

FIGS. 4A to 4C are graphs showing the relationship between current density and resistance when red, green, and blue light emitting elements are applied to a single stack and a tandem structure (including multiple stacks).

As can be seen from FIGS. 4A to 4C, the tandem structure has a greater resistance of red, green, and blue light emitting elements at the same current density than that of the single stack.

As described above, a higher driving voltage is applied to the tandem structure than a single stack and the tandem structure has a higher resistance than a single stack because as the number of organic layers provided between the first electrode and the second electrode of the tandem structure increases, the resistance increases, and thus the required driving voltage increases, which increases power consumption.

The light emitting display device of the present disclosure includes a connection portion CT configured to connect the charge generation layer between the first stack and the second stack to the second electrode in the non-light emitting portion, to impart a common potential to the charge generation layer, the second stack, and the second electrode in the non-light emitting portion and thereby remove the cause of resistance increase due to the second stack, which can improve image quality and reduce power consumption.

Hereinafter, a light emitting display device of the present disclosure will be described with reference to drawings showing various examples of connection portions in a light emitting display device having light emitting portions of different colors.

Figure 5:
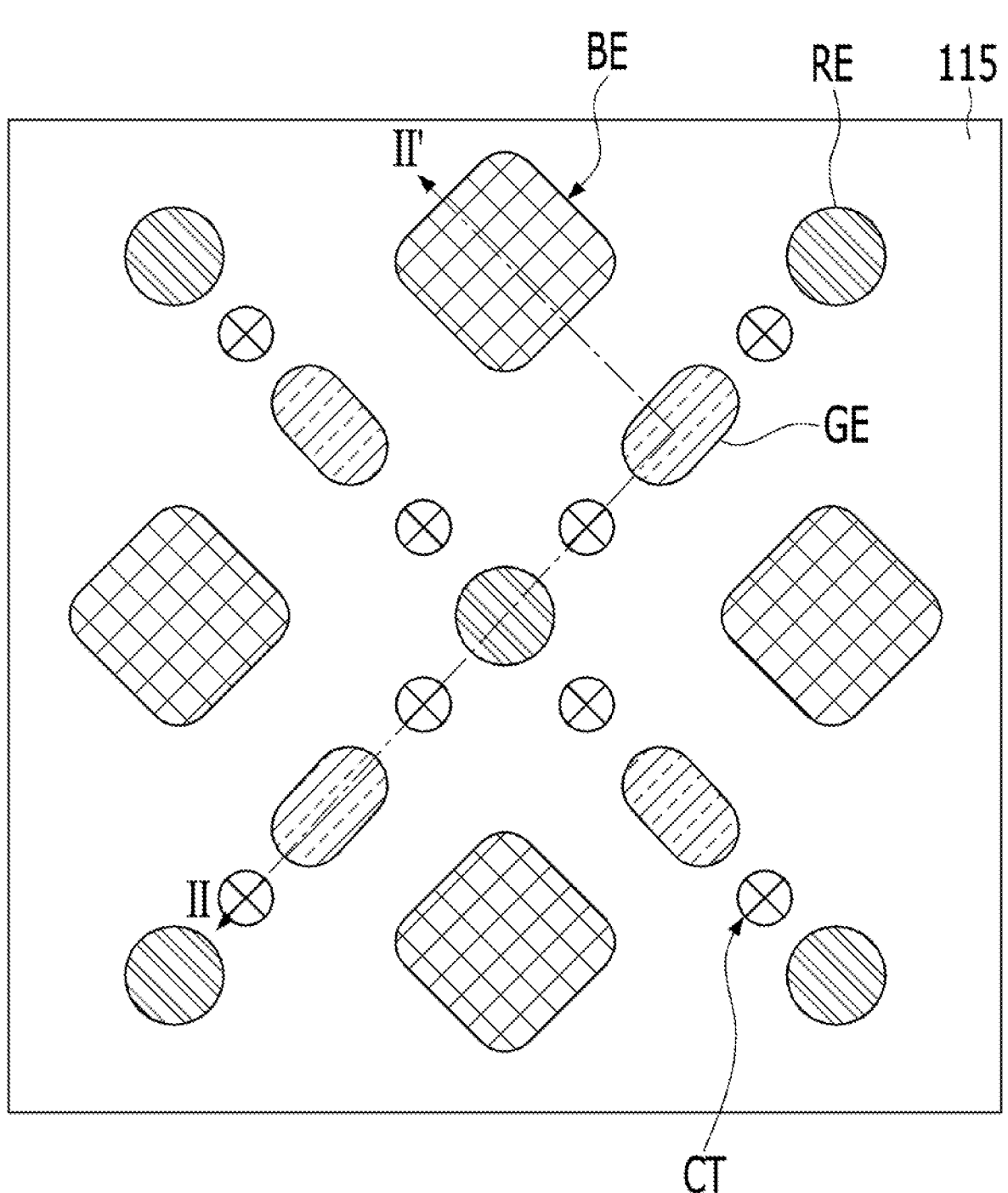
FIG. 5 is a plan view illustrating a light emitting display device according to an embodiment of the present disclo-sure.
Figure 6:
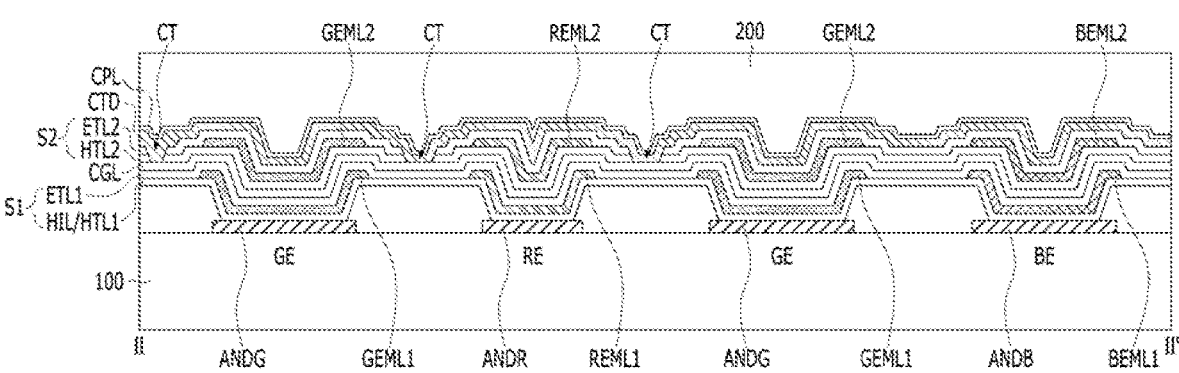
FIG. 6 is a cross-sectional view taken along line II to II' of FIG. 5 according to an embodiment of the present disclosure.

FIG. 5 is a plan view illustrating a light emitting display device according to a first embodiment of the present disclosure and FIG. 6 is a cross-sectional view taken along line II to II' of FIG. 5.

As shown in FIGS. 5 and 6, a first embodiment of the light emitting display device according to the present disclosure shows an example in which the connection portion CT is provided around a red light emitting portion RE.

The example shown in FIG. 5 has a configuration of an arrangement of the red light emitting portion RE, the green light emitting portion GE, and the blue light emitting portion BE, in which the green light emitting portion GE and the red light emitting portion RE are alternately and repeatedly arranged in a first diagonal line, and the blue light emitting portion BE and the green light emitting portion GE are alternately and repeatedly arranged in a second diagonal line adjacent to and parallel to the first diagonal line. In addition, in the illustrated example, the sizes of the blue light emitting portion BE, the green light emitting portion GE, and the red light emitting portion RE decrease in this order. Low visibility of blue can be compensated for when the area of the blue light emitting portion BE is greater than that of the other color light emitting portions GE and RE. In addition, since green has the highest efficiency among red, green, and blue when realizing white luminance in a light emitting display device, more green light emitting portions GE are provided than other color light emitting portions BE and RE, so that the same driving voltage can be obtained and thus white efficiency is increased.

The red light emitting portion RE has a circular shape, but the shape thereof is not limited thereto and can be changed to a polygonal or circular shape.

In addition, as shown in FIG. 5, the green light emitting portion GE can have an elongated ellipse shape in first and second diagonal directions or an elongated ellipse shape in a diagonal line intersecting the first and second diagonal lines. In this situation, the green light emitting portions GE that are arranged to cross each other can have an effect of compensating for viewing angles in different directions. However, the shape of the green light emitting portion GE is not limited thereto and can be changed to a polygonal or circular shape different from that of FIG. 5.

As illustrated, the blue light emitting portion BE can have a lozenge shape in which each corner is rounded, but is not limited thereto. The blue light emitting portion BE can be changed into a polygonal shape, a circular shape, or an elliptical shape.

The light emitting display device of the present disclosure is not limited to the arrangement and shape of the light emitting portions shown in FIG. 5 and can be changed in various ways as long as it includes the connection portion CT between the charge generation layer and the second electrode of the non-light emitting portion around the light emitting portion.

The light emitting display device of the present disclosure according to the first embodiment includes a connection portion CT between a red light emitting portion RE and a green light emitting portion GE adjacent to the red light emitting portion.

As shown in FIGS. 5 and 6, the light emitting display device according to the first embodiment of the present disclosure further includes a bank 115 in a non-light emitting portion between the light emitting portions RE, GE, and BE, the bank covers the edges of the first electrodes ANDR, ANDG, and ANDB of the respective light emitting portions RE, GE, and BE, and the light emitting display device can include the first stack S1, the charge generation layer CGL, the second stack S2 and the second electrode CTD on the bank 115.

The light emitting display device can include light emitting layers REML1/REML2, GEML1/GEML2, and BEML1/BEML2 in at least the light emitting portions RE, GE, and BE, compared to the first stack S1 and the second stack S2 on the bank 115 disposed in the non-light emitting portion NE.

Portions of the second stack S2 are removed to from the connection portion CT, so that the second hole transport layer HTL2 and the second electron transport layer ETL2 of the second stack S2 are side-connected to the second electrode CTD, and a part of the top of the charge generation layer CGL exposed at the connection portion CT can be directly connected to the second electrode CTD. In the light emitting display device according to the first embodiment of the present disclosure, the charge generation layer CGL disposed in a lower part and the second electrode CTD disposed in a higher part are connected to each other through the connection portion CT in the non-light emitting portion, so that a current flowing between the first electrodes ANDR, ANDG, and ANDB and the second electrode CTD in the connection portion CT directly flows from the charge generation layer CGL to the second electrode CTD without the second stack S2. Therefore, the current does not pass through the second stack S2, which is a major cause of luminance change due to temperature change in the connection portion CT of the non-light emitting portion, to reduce the resistance and thus supply a level of current that is the same as or similar to having only a single stack between the first electrodes ANDR, ANDG, and ANDB and the second electrode CTD. Accordingly, a light emitting display device having a tandem structure having a connection portion between the charge generation layer and the second electrode in the non-light emitting portion can reduce a change in luminance when the temperature changes to be equal to or similar to the level of luminance change experienced by a single-stack light emitting display device.

In addition, the light emitting display device according to the first embodiment of the present disclosure has a configuration in which the connection portion CT is provided in the non-light emitting portion around the red light emitting portion RE, so that the second hole transport layer HTL2 and the second electron transport layer ETL2, which constitute the common layer of the second stack S2, are disconnected in an area between the red light emitting portion RE and the adjacent light emitting portion, to prevent or reduce lateral leakage current from flowing between the red light emitting portion RE and the green light emitting portion GE. As a result, when the light emitting portion of a specific color is turned on, a phenomenon in which adjacent light emitting portions of other colors emit light due to lateral leakage current can be prevented, which improves quality.

In addition, the connection portion CT configured to connect the charge generation layer to the second electrode CTD as a common layer is provided so that lateral leakage current due to the common layer can be prevented.

Therefore, the light emitting display device according to the first example embodiment of the present disclosure includes a connection portion disposed in an area around the red light emitting portion, so that when selectively turning on a blue light emitting portion or selectively turning on a green light emitting portion, the phenomenon, in which adjacent red light emitting portions are turned on, can be prevented even if the turn-on voltage of the red light emitting portion is lower than the turn-on voltage of each of the blue light emitting portion and the green light emitting portion. That is, leakage of light other than red can be prevented when the light emitting portion of a different color from the red light emitting portion is turned on.

The structure of the red light emitting element included in the red light emitting portion RE will be described with reference to FIG. 6.

The red light emitting element includes at least a first electrode ANDR provided on the substrate 100 corresponding to the red light emitting portion RE, at least two first and second stacks S1 and S2 on the first electrode ANDR, a charge generation layer CGL between the first and second stacks S1 and S2, and a second electrode CTD on the second stack S2.

Similarly, the green light emitting element includes at least a first electrode ANDG provided on the substrate 100 corresponding to the green light emitting portion GE, at least two first and second stacks S1 and S2 on the first electrode ANDG, a charge generation layer CGL between the first and second stacks S1 and S2, and a second electrode CTD on the second stack S2.

In addition, the blue light emitting element includes at least a first electrode ANDB provided on the substrate 100 corresponding to the blue light emitting portion BE, at least two first and second stacks S1 and S2 on the first electrode ANDB, a charge generation layer CGL between the first and second stacks S1 and S2, and a second electrode CTD on the second stack S2.

In the red light emitting portion RE, the green light emitting portion GE, and the blue light emitting portion BE, the first stack S1 includes a hole injection layer HIL, a first hole transport layer HTL1, a first light emitting layer REML1, GEML1 and BEML1, and a first electron transport layer ETL1, and the second stack S2 includes a second hole transport layer HTL2, second light emitting layers REML2, GEML2 and BEML2, and a second electron transport layer ETL2. The red light emitting portion RE, the green light emitting portion GE, and the blue light emitting portion BE can be defined by the openings of the bank 115, and the bank 115 can cover edges of the first electrodes ANDR, ANDG, and ANDB provided in the red light emitting portion RE, the green light emitting portion GE, and the blue light emitting portion BE. The first and second light emitting layers REML1/REML2, GEML1/GEML2, and BEML1/BEML2 can partially overlap with the non-light emitting portions between the light emitting portions RE, GE, and BE. The first red light emitting layer REML1 of the first stack S1 can overlap with the second red light emitting layer REML2 of the second stack S2 in the red light emitting portion RE. The first green light emitting layer GEML1 of the first stack S1 can overlap with the second green light emitting layer GEML2 of the second stack S2 in the green light emitting portion GE. The first blue light emitting layer BEML1 of the first stack S1 can overlap with the second blue light emitting layer BEML2 of the second stack S2 in the blue light emitting portion BE.

Between the hole transport layers HTL1 and HTL2 and the electron transport layers ETL1 and ETL2 in the first and second stacks S1 and S2, respectively, the red light emitting portion RE includes first and second red light emitting layers REML1 and REML2 emitting red light, the green light emitting portion GE includes first and second green light emitting layers GEML1 and GEML2 emitting green light, and the blue light emitting portion BE has first and second blue light emitting layers BEML1 and BEML2 emitting blue light.

The light emitting display device according to the first embodiment of the present disclosure can have a configuration in which the first and second red light emitting layers REML1 and REML2 provided in the red light emitting portion RE have edges spaced apart from the connection portion CT. In this situation, the openings of the fine metal mask forming the first and second red light emitting layers REML1 and REML2 do not overlap with the connection portion CT in order to provide a secure connection between the second electrode CTD and the charge generation layer CGL in the connection portion.

The hole injection layer HIL, the first and second hole transport layers HTL1 and HTL2, the first and second electron transport layers ETL1 and ETL2, and the charge generation layer CGL excluding the first and second red light emitting layers REML1 and REML2, the first and second green light emitting layers GEML1 and GEML2, and the first and second blue light emitting layers BEML1 and BEML2 in the first and second stacks S1 and S2 are common to the light emitting portion and the non-light emitting portion. The light emitting display device according to the first embodiment of the present disclosure is characterized in that portions of the second hole transport layer HTL2 and the second electron transport layer ETL2, which are common layers of the second stack S2, are removed in only a part of the area adjacent to the red light emitting portion RE among the non-light emitting portions to directly connect the second electrode CTD to the charge generation layer CGL.

The example shown in FIG. 6 has a configuration in which two stacks are included between the first and second electrodes ANDR and CTD, but is not limited thereto. Three stacks divided by the charge generation layer can be further provided between the first and second electrodes ANDR and CTD.

When three or more stacks are provided between the first and second electrodes ANDR and CTD, the connection portion CT can further pass through the two or more stacks up to the lowermost charge generation layer in order to directly contact the lowermost charge generation layer.

Meanwhile, a capping layer CPL 140 is further provided on the second electrode CTD to protect the light emitting elements provided in the respective light emitting portions RE, GE, and BE, and to increase light emitting efficiency.

An encapsulation layer 200 can be further provided on the capping layer 140 to protect the sub-pixels SP provided on the substrate 100 and block external moisture. The encapsulation layer 200 can include, for example, a stack structure of one or more pairs of alternating organic layers and inorganic layers.

Meanwhile, as shown in FIG. 2, a thin film transistor is provided between the substrate 100 and the light emitting element of each light emitting portion so that the light emitting element can receive an electrical signal.

Figure 7:
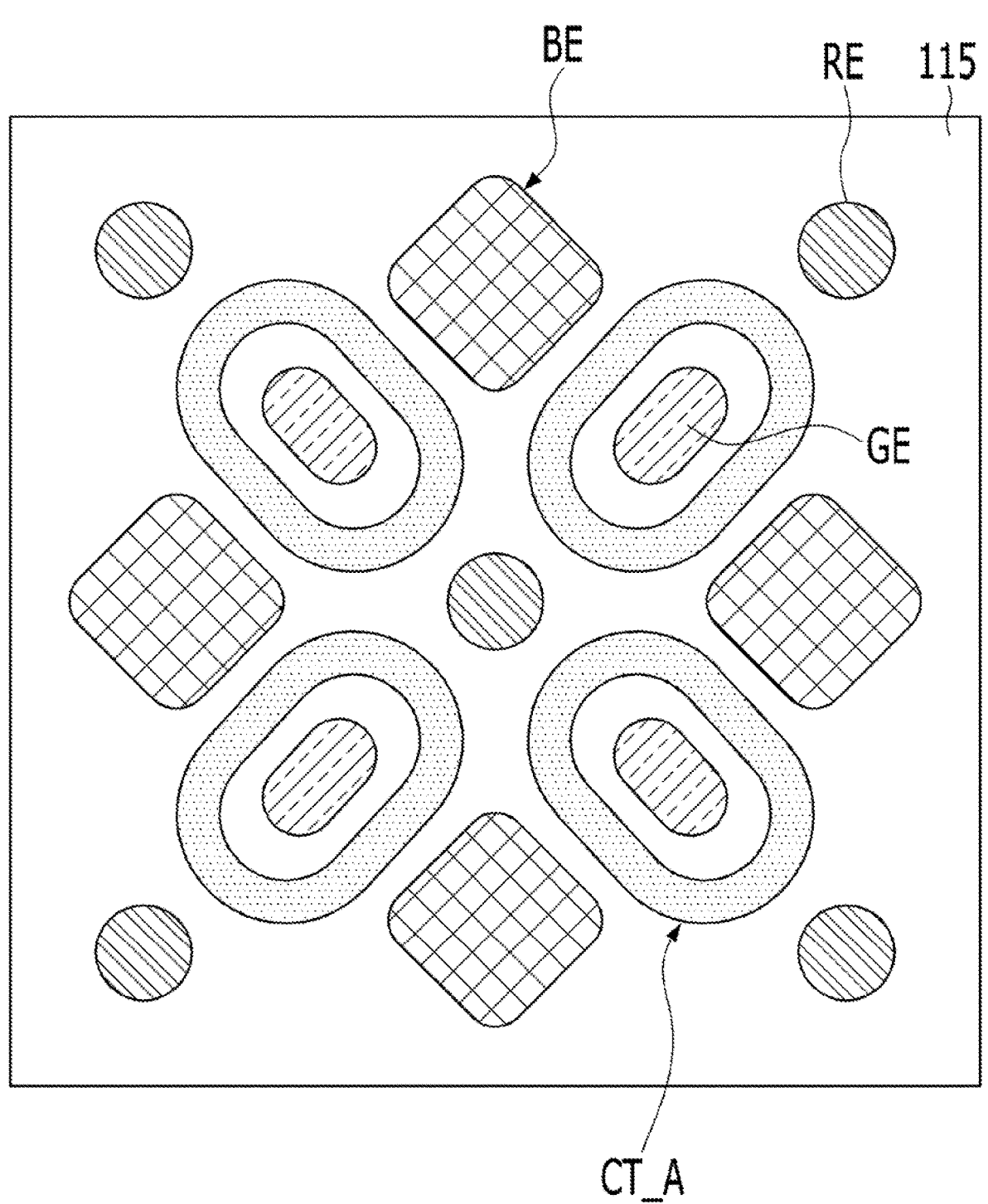
FIG. 7 is a plan view illustrating a modified example of the light emitting display device according to an embodiment of the present disclosure.

FIG. 7 is a plan view illustrating a modified example of the light emitting display device according to the first embodiment of the present disclosure.

As shown in FIG. 7, in the light emitting display device according to the modified example of the first embodiment of the present disclosure, a connection portion CT_A between the second electrode and the charge generation layer can be a closed loop surrounding one light emitting portion GE, BE, or RE. Alternatively, two or more, or all of the different colored light emitting portions can have a connection portion CT_A disposed around each one in a close loop shape. FIG. 7 shows the connection portion CT_A having the shape of a closed loop (e.g., a ring shape or a moat shape) surrounding the green light emitting portion GE, but is not limited thereto. The connection portion CT_A can be in the form of a closed ring surrounding the blue light emitting portion BE or the red light emitting portion RE. The closed loop-shaped connection portion CT_A is spaced apart from the adjacent light emitting portions GE, BE, and RE, to prevent deterioration in the light emitting characteristics of the light emitting portions GE, BE, and RE.

Hereinafter, the I-V characteristics will be determined depending on the structure by changing the layers in the second stack between the charge generation layer and the second electrode.

FIGS. 8A to 8D are cross-sectional views illustrating light emitting elements according to first to fourth experimental examples.

Figure 8A:
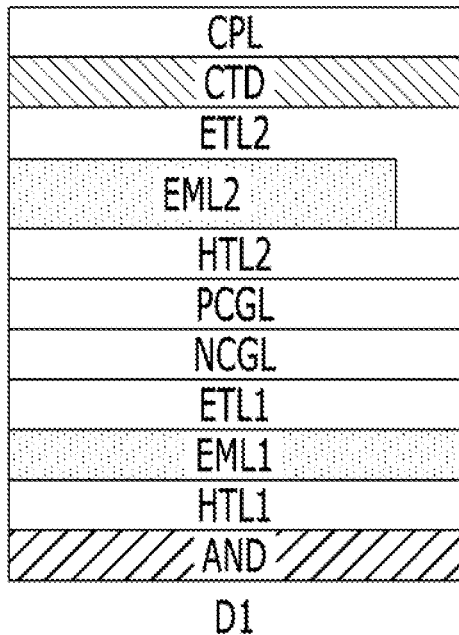
FIGS. 8A to 8D are cross-sectional views illustrating light emitting elements according to first to fourth experimental examples according to embodiments of the present disclosure.

As shown in FIG. 8A, the light emitting element D1 of the first experimental example according to an embodiment of the present disclosure includes, between the first electrode AND and the second electrode CTD, sequentially, a first stack including a first hole transport layer HTL1, a first light emitting layer EML1, and a first electron transport layer ETL1, a charge generation layer including an n-type charge generation layer NCGL and a p-type charge generation layer PCGL, and a second stack including a second hole transport layer HTL2, a second light emitting layer EML2, and a second electron transport layer ETL2. The second light emitting layer EML2 is formed in the light emitting portion selected through the opening of the mask, is formed over the entire surface, and is disposed in a smaller area than the second hole transport layer HTL2 and the second electron transport layer ETL2, respectively, disposed thereon and thereunder, and the second electron transport layer ETL2 can cover the side of the second light emitting layer EML2 and can directly contact the lower second hole transport layer HTL2.

Figure 8B:
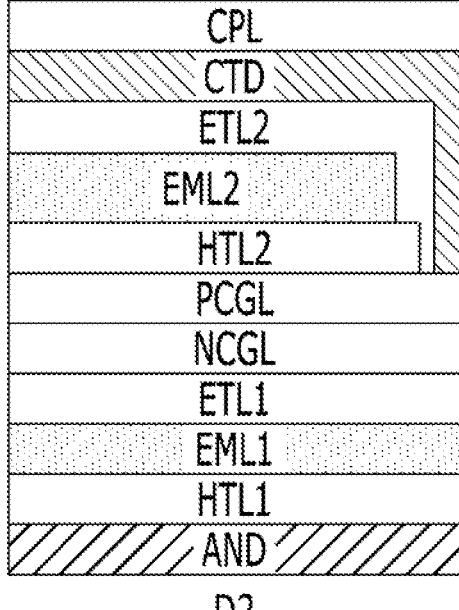

In the light emitting element D2 according to the second experimental example of FIG. 8B, the second electrode CTD directly contacts the charge generation layer, and is a light emitting display device according to an embodiment of the present disclosure. The stack configuration of the first stack and the charge generation layer of the second experimental example is the same as that of the light emitting element according to the first experimental example described with reference to FIG. 8A. The top of the upper p-type charge generation layer PCGL in the double-layered charge generation layer of the n-type charge generation layer NCGL and the p-type charge generation layer PCGL in the light emitting element according to the second experimental example is directly connected to the second electrode CTD, and portions of the second hole transport layer HTL2 and the second electron transport layer ETL2 of the second stack are removed from the connection portion, to form a direct connection between the second electrode CTD and the p-type charge generation layer PCGL.

Figure 8C:
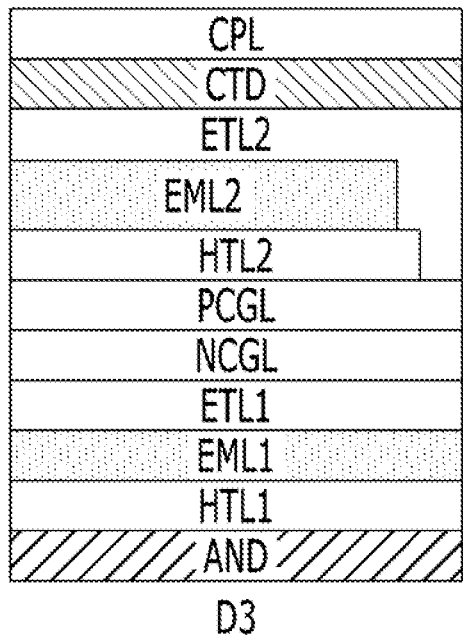

In the light emitting element D3 according to the third experimental example of FIG. 8C according to an embodiment of the present disclosure, only the second hole transport layer HTL2 is patterned in the second stack and the second electron transport layer ETL2 is formed over the entire surface, so that the second electron transport layer ETL2 is directly connected to the p-type charge generation layer PCGL.

Figure 8D:
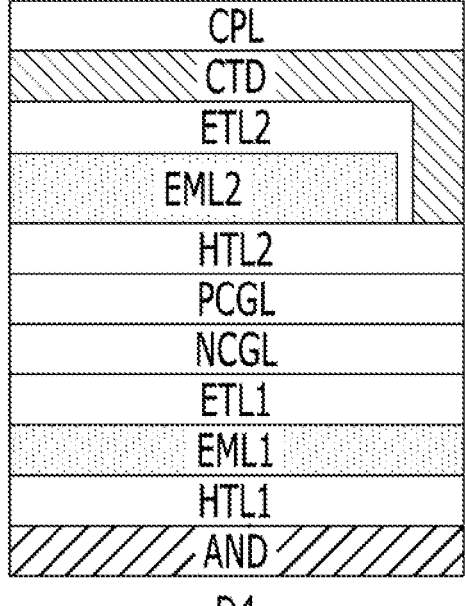

The light emitting element D4 according to the fourth experimental example of FIG. 8D according to an embodiment of the present disclosure has a configuration in which only the second electron transport layer ETL2 is patterned in the second stack, the second hole transport layer HTL2 is formed over the entire surface, the second hole transport layer HTL2 and the p-type charge generation layer PCGL are connected similarly to the light emitting element D1 of the first experimental example, and the second electrode CTD has a direct connection to the second hole transport layer HTL2.

The light emitting elements according to the first to fourth experimental examples further include a capping layer CPL on the second electrode CTD in common.

Figure 9A:
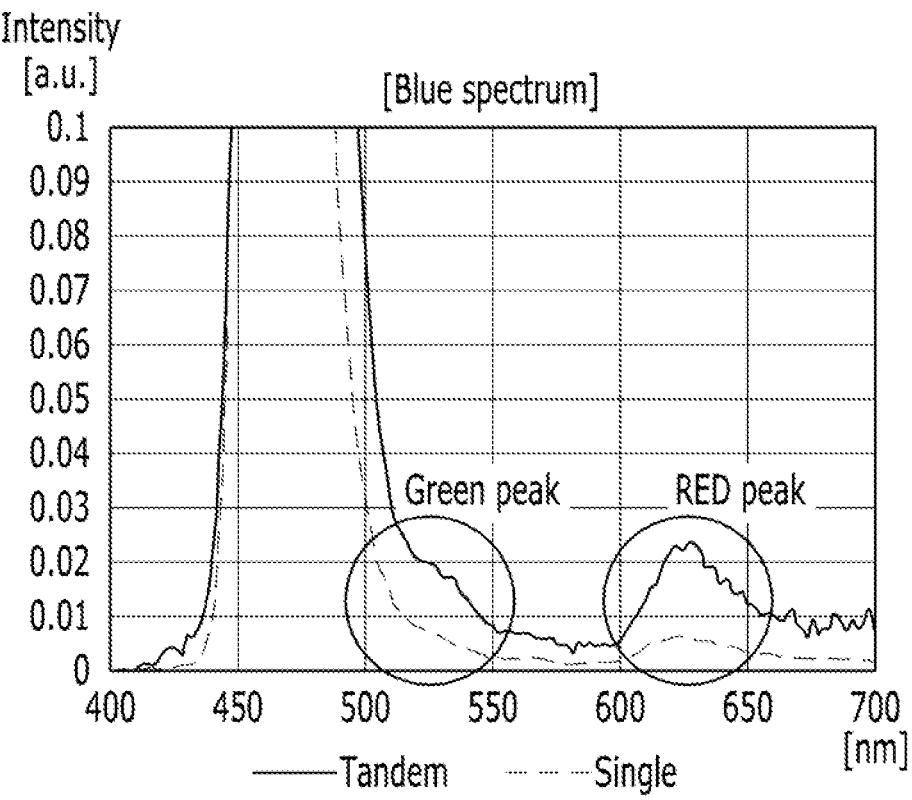
FIGS. 9A and 9B are graphs illustrating light emitting spectra of blue sub-pixels according to the first and second experimental examples when driven at a low gradation according to embodiments of the present disclosure.
Figure 9B:
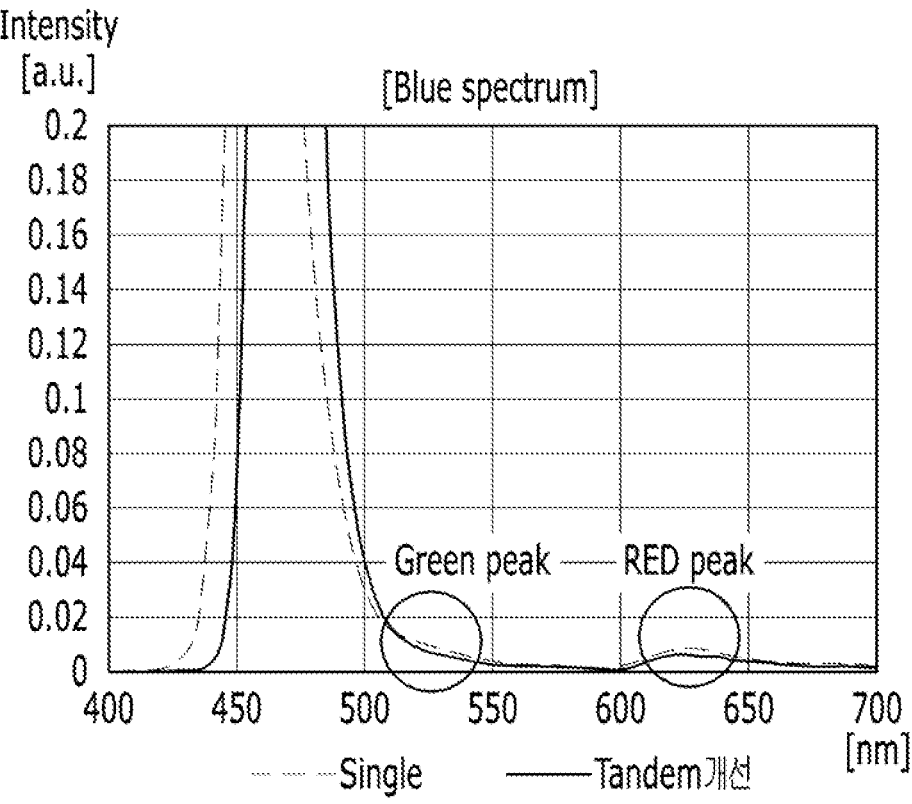

FIGS. 9A and 9B are graphs illustrating light emitting spectra of blue sub-pixels according to the first and second experimental examples when driven at a low gradation.

In the light emitting device D1 of the first experimental example according to FIG. 8A having the common layers HTL2 and ETL2 in the second stack, light leakage is generated in the green light emitting portion and the red light emitting portion having a lower turn-on voltage than that of the blue light emitting portion when the blue light emitting portion is driven at a low gradation, so that green light and red light are emitted even when blue light is emitted, as shown in FIG. 9A.

Meanwhile, as shown in FIG. 8B, the light emitting element D2 of the second experimental example, in which the removed connection portion has a through-hole shape and is electrically connected to the second electrode CTD and the p-type charge generation layer PCGL has a configuration in which the common layer of the second stack of the blue light emitting portion and the adjacent green and red light emitting portions is disconnected, and the common layers HTL2 and ETL2 of the second stack between the light emitting portions emitting light of different colors does not generate lateral leakage current. Therefore, as shown in FIG. 9B, generation of leakage light of other colors due to lateral leakage current can be remarkably prevented even when blue light is emitted in a low gradation. In addition, the light emitting element D2 of the second experimental example having the direct connection between the second electrode and the charge generation layer can remove the effect of the resistance of the second stack, thereby reducing the luminance change when the temperature changes.

The light emitting element according to the third experimental example of FIG. 8C and the light emitting element according to the fourth experimental example of FIG. 8D have a configuration in which only a portion of the common layer is removed in the second stack and exhibit reduced leakage light compared to the first experimental example The fifth to thirteenth experimental examples DOE1 to DOE9 differ from each other in the configuration of the second stack. In the fifth experimental example DOE1, the second hole transport layer HTL2 has a first thickness H1, the second light emitting layer EML2 is provided and the second electron transport layer ETL2 has a second thickness H2.

TABLE 2

| Component | DOE1 | DOE2 | DOE3 | DOE4 | DOE5 | DOE6 | DOE7 | DOE8 | DOE9 |
|---|---|---|---|---|---|---|---|---|---|
| CPL | Present | Present | Present | Present | Present | Present | Present | Present | Present |
| CTD | Present | Present | Present | Present | Present | Present | Present | Present | Present |
| ETL2 | H2 | Absent | H2 | H2/2 | H2/4 | Absent | H2 | Absent | H2/2 |
| EML2 | Present | Absent | Absent | Absent | Absent | Absent | Absent | Absent | Absent |
| HTL2 | H1 | Absent | H1 | H1/2 | H1/4 | H1 | Absent | H1/2 | Absent |
| PCGL | | | | | Present | | | | |
| NCGL | | | | | Present | | | | |
| ETL1 | | | | | Present | | | | |
| EML1 | | | | | Present | | | | |
| HTL1 | | | | | Present | | | | | and increased leakage light compared to the second experimental example upon low-gradation blue emission under the same conditions. Fifth to thirteenth experimental examples will be described later.

Figure 10:
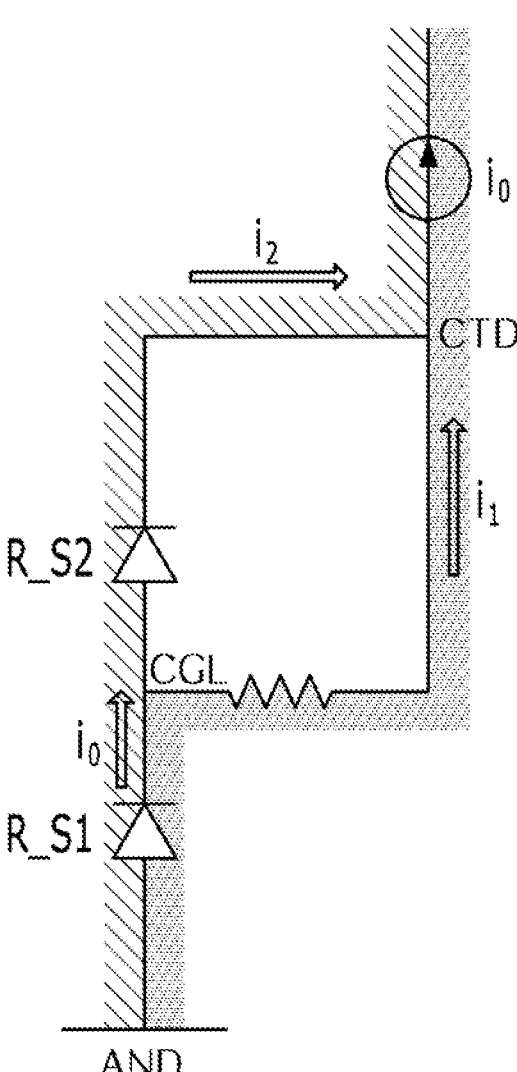
FIG. 10 is a circuit diagram schematically illustrating a current flow of the light emitting elements according to the first and second experimental examples according to embodiments of the present disclosure.

FIG. 10 is a circuit diagram schematically illustrating a current flow of the light emitting elements according to the first and second experimental examples.

As shown in FIG. 10, the light emitting element D1 according to the first experimental example has a configuration in which a first stack S1 and a second stack S2 having a light emitting function are connected in series between the first electrode AND and the second electrode CTD. In consideration of the circuit, the first stack S1 between the first electrode AND and the charge generation layer CGL acts as a first resistance R_S1, and the second stack S2 between the charge generation layer CGL and the second electrode CTD act as a second resistance R_S2. In this situation, in the light emitting element D1 according to the first experimental example, the current i0 passing through the first resistance R_S1 of the first stack S1 to the charge generation layer CGL in the vertical direction passes through the second resistance R_S2 and transmits current i2 to the second electrode CTD, in which current i2 is less than current i0.

Meanwhile, in the light emitting element D2 according to the second experimental example, the first stack S1 acts as the first resistance R_S1 in the same way as in the first experimental example D1, but the charge generation layer CGL and the second electrode (CTD) are directly connected to each other, such that there is no influence of the resistance of the second stack in the vertical direction, current i0 supplied through the first stack S1 to the charge generation layer CGL is transferred to the second electrode CTD, and thus current reduction caused by the second stack can be prevented.

Table 2 shows the light emitting elements of the fifth to thirteenth experimental examples DOE1 to DOE9 according to various embodiments of the present disclosure that have the same configurations in the first stack S1 including the first electrode AND, the first hole transport layer HTL1, and the first light emitting layer EML1, the charge generation layer in which the n-type charge generation layer NCGL and the p-type charge generation layer PCGL are stacked, the second electrode CTD, and the capping layer CPL.

The light emitting element DOE2 of the sixth experimental example has the same stack structure as the stack configuration of the light emitting element D2 of the second experimental example of FIG. 8B, except that there is a direct connection portion between the second electrode CTD and the charge generation layer PCGL, and the second hole transport layer HTL2, the second light emitting layer EML2, and the second electron transport layer ETL2 are removed from the direct connection portion, compared to the fifth experimental example DOE1. The light emitting element DOE3 of the seventh experimental example has the same stack structure as the stack configuration of the light emitting element D1 of the first experimental example of FIG. 8B. The second light emitting layer EML2 is patterned and partially removed, the second hole transport layer HTL2 of the second stack has a first thickness H1, and the second electron transport layer ETL2 has a second thickness H2.

The thickness of the common layer in the second stack of the light emitting element DOE4 of the eighth experimental example is reduced by half compared to the light emitting element DOE3 of the seventh experimental example, the second light emitting layer EML2 is patterned and partially removed, the second hole transport layer HTL2 of the second stack has a first thickness×0.5 (H1/2), and the second electron transport layer ETL2 has a second thickness×0.5 (H2/2).

The thickness of the common layer in the second stack of the light emitting element DOE5 of the ninth experimental example is reduced by ¼ compared to the light emitting element DOE3 of the seventh experimental example, the second light emitting layer EML2 is patterned and partially removed, the second hole transport layer HTL2 of the second stack has a first thickness×0.25 (H1/4), and the second electron transport layer ETL2 has a second thickness×0.25 (H2/4).

The light emitting element DOE6 of the tenth experimental example is the same as the light emitting element D4 of the fourth experimental example of FIG. 8D. In the second stack, the second light emitting layer EML2 is patterned and partially removed, the second hole transport layer HTL2 has a first thickness H1, and the second electron transport layer ETL2 is partially removed, to connect the second electrode CTD to the second hole transport layer HTL2.

The light emitting element DOE7 of the eleventh experimental example is the same as the light emitting element D3 of the third experimental example of FIG. 8C. In the second stack, the second light emitting layer EML2 is patterned and partially removed, the second hole transport layer HTL2 of the second stack is removed, and the second electron transport layer ETL2 remains to the second thickness H2. In the light emitting element DOE7 of the eleventh experimental example, the second light emitting layer EML2 and the second hole transport layer HTL2 are removed so that the second electron transport layer ETL2 has a connection portion with the p-type charge generation layer PCGL.

The light emitting element DOE8 of the twelfth experimental example is a modified example of the tenth experimental example DOE6 and has a configuration in which, in the second stack, the second light emitting layer EML2 is patterned and partially removed, the second hole transport layer of the second stack (HTL2) has a first thickness×0.5 (H1/2), and the second electron transport layer ETL2 is partially removed to connect the second electrode CTD to the thin second hole transport layer HTL2.

The light emitting element DOE9 of the thirteenth experimental example is a modified example of the eleventh experimental example DOE7 and has a configuration in which the second light emitting layer EML2 in the second stack is patterned and partially removed, the second hole transport layer of the second stack HTL2 is removed, and the second electron transport layer ETL2 has a second thickness×0.5 (H2/2). In this situation, the light emitting element DOE9 of the thirteenth experimental example has a configuration in which the second light emitting layer EML2 and the second hole transport layer HTL2 are removed, and the thin second electron transport layer ETL2 is connected to the p-type charge generation layer PCGL.

Figure 11:
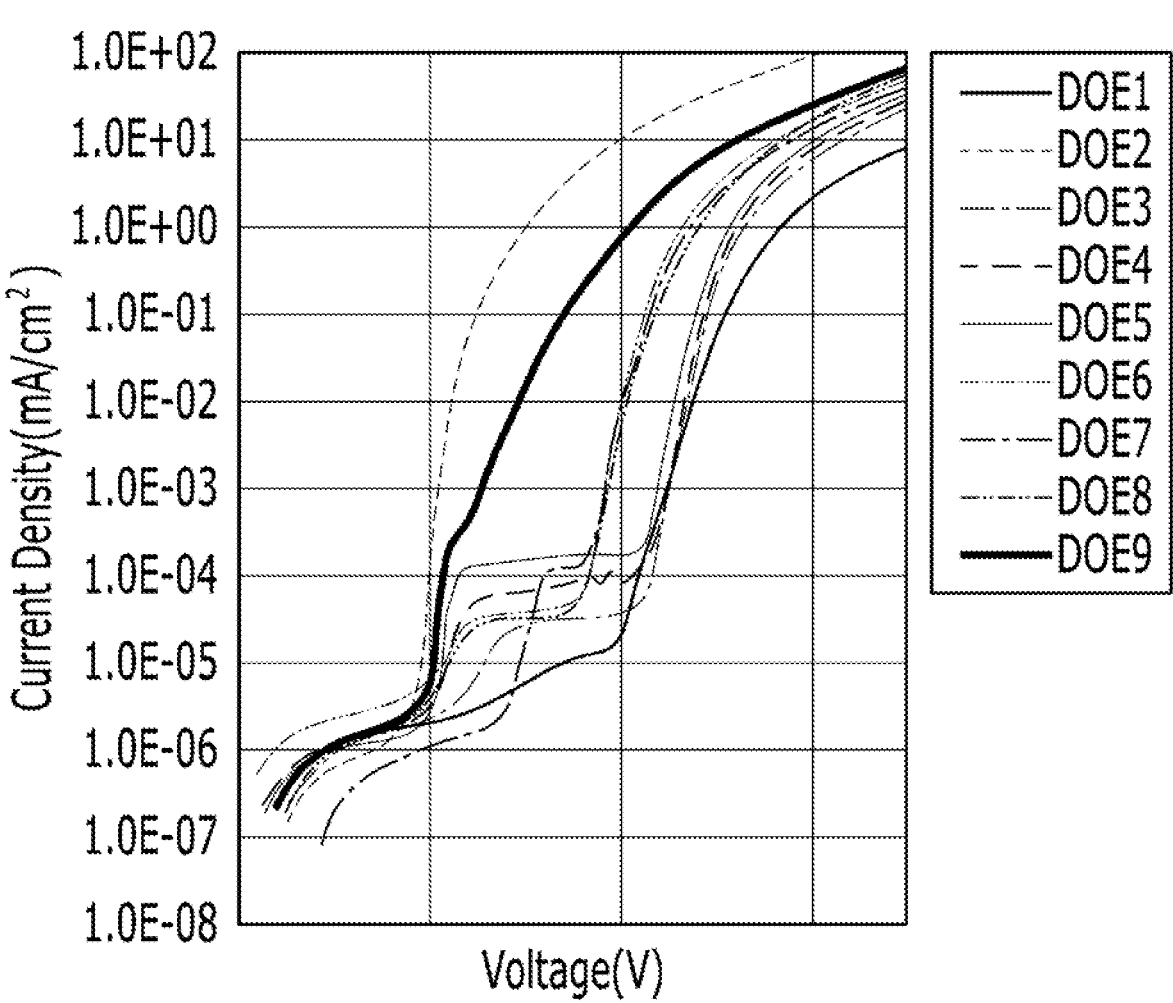
FIG. 11 is a graph showing I-V characteristics according to the fifth to thirteenth experimental examples according to embodiments of the present disclosure.

FIG. 11 is a graph showing I-V characteristics according to the fifth to thirteenth experimental examples.

Comparing the fifth experimental example DOE1 with the sixth experimental example DOE2, in the sixth experimental example DOE2, the turn-on driving voltage is reduced due to the resistance reduction by removal of the common layer of the second stack.

In addition, comparing the fifth experimental example DOE1 with the seventh to ninth experimental examples DOE3, DOE4, and DOE5, the I-V curve is slightly improved due to the resistance reduction caused by the removal of the second light emitting layer EML2 in the seventh to ninth experimental examples DOE3, DOE4, and DOE5, and the current density is improved at the constant driving voltage in the seventh to ninth experimental examples DOE3, DOE4, and DOE5 in this order.

Removing the entirety of the second electron transport layer ETL2 or the entirety of the second hole transport layer HTL2 as in the tenth experimental example DOE6 and the eleventh experimental example DOE7 is more effective in reducing the driving voltage, compared to leaving all or part of the second hole transport layer HTL2 and the second electron transport layer ETL2 as in the seventh to ninth experimental examples DOE3, DOE4, and DOE5.

In addition, comparing the twelfth experimental example DOE8 with the thirteenth experimental example DOE9, the thirteenth experimental example DOE9 having a thin second electron transport layer ETL2 in the second stack S2 is more effective in improving I-V curve characteristics, compared to the twelfth experimental example DOE8 having a thin second hole transport layer HTL2.

The most effective experimental examples is the situation where all of the common layers HTL2 and ETL2, and the light emitting layer EML2 of the second stack are removed, like the sixth experimental example DOE6. As shown in the current path of the D2 element in FIG. 10, the node of the charge generation layer CGL is directly connected to the node of the second electrode CTD, so that the resistance due to the second stack S2 does not affect the current transferred to the second electrode CTD, and the current i0 transferred to the charge generation layer CGL is transferred to the second electrode CTD. Therefore, the light emitting display device of the present disclosure has a direct connection between the second electrode and the charge generation layer by removing at least a portion of the common layer from the second stack, so that the resistance in the vertical direction is reduced to remove the cause of the increase in resistance due to the increased common layer, to reduce the change in luminance due to the change in temperature and thereby to improve reliability of the light emitting element and the light emitting display device.

Hereinafter, a light emitting display device according to another embodiment of the present disclosure will be described.

Figure 12:
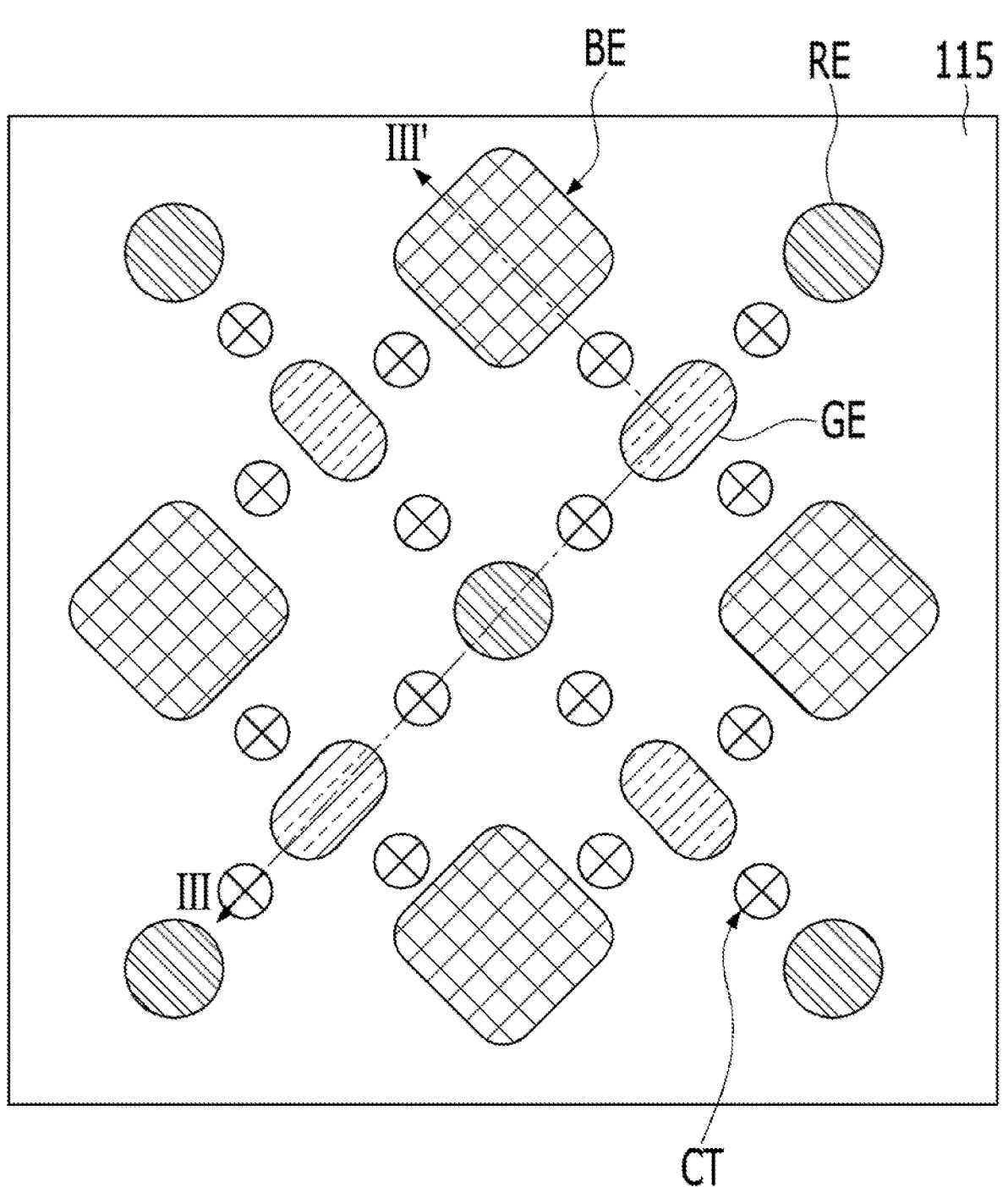
FIG. 12 is a plan view illustrating a light emitting display device according to another embodiment of the present disclosure.
Figure 13:
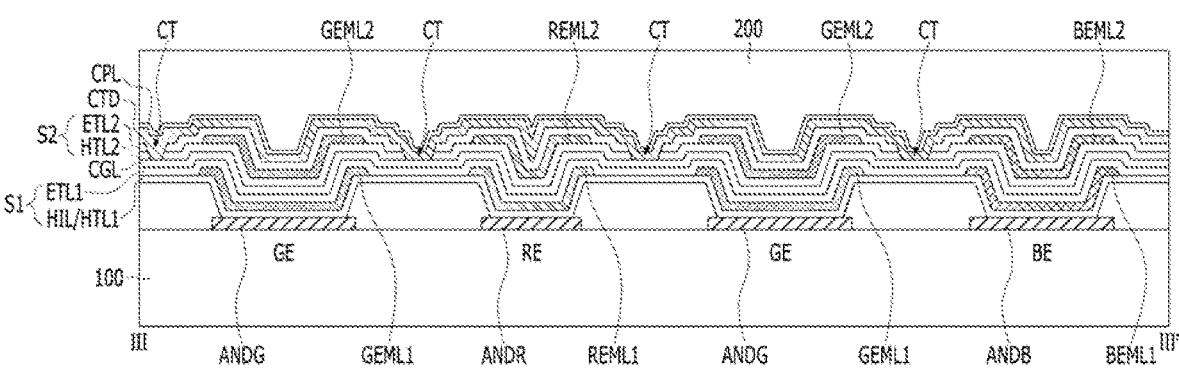
FIG. 13 is a cross-sectional view taken along line III to III' of FIG. 12 according to an embodiment of the present disclosure.

FIG. 12 is a plan view illustrating a light emitting display device according to a second embodiment of the present disclosure, and FIG. 13 is a cross-sectional view taken along line III to III' of FIG. 12.

As shown in FIGS. 12 and 13, the light emitting display device according to the second embodiment of the present disclosure has a configuration in which the connection portion CT is provided in the non-light emitting portion around the green light emitting portion GE, and the second hole transport layer HTL2 and the second electron transport layer ETL2, which are common layers of the second stack S2, are disconnected from the green light emitting portion GE at a portion facing the adjacent light emitting portion, thereby reducing or preventing lateral leakage current flowing between the green light emitting portion GE and the red light emitting portion RE, and between the green light emitting portion GE and the blue light emitting portion BE. In other words, each green light emitting portion GE has four connection portions CT disposed at four sides of the correspond green light emitting portion GE (e.g., there is a connection portion CT between the green light emitting portion GE and each adjacent light emitting portion).

In addition, by providing a connection portion CT connecting the charge generation layer CGL as a common layer to the second electrode CTD, lateral leakage current due to the common layers HTL2 and ETL2 in the second stack S2 can be prevented.

Accordingly, the light emitting display device according to the second embodiment of the present disclosure includes a connection portion CT between a green light emitting portion GE and the non-light emitting portion spaced apart from the adjacent green light emitting portion GE, so that even if the turn-on voltage of the red light emitting portion is lower than the turn-on voltage of each of the blue light emitting portion and the green light emitting portion, when the blue light emitting portion is selectively turned on or the green light emitting portion is selectively turned on, a phenomenon in which the adjacent red light emitting portion is turned on can be prevented. That is, when the green light emitting portion GE and the other color light emitting portions RE and BE are turned on, generation of leakage light other than the green light can be prevented. For example, the green light emitting portion GE can be surrounded by connection portions CT on all sides, and the red light emitting portion RE can be surrounded by connection portions CT on all sides.

The second stack S2 is removed from the connection portion CT, so that the second hole transport layer HTL2 and the second electron transport layer ETL2 of the second stack S2 can be side-connected to the second electrode CTD and a part of the top of the charge generation layer CGL exposed at the connection portion CT can be directly connected to the second electrode CTD. The light emitting display device according to the second embodiment of the present disclosure has a configuration in which the charge generation layer CGL and the second electrode CTD disposed thereunder and thereon, respectively, are connected to each other in the connection portion CT in the non-light emitting portion so that the current flowing between the first electrodes ANDR, ANDG, and ANDB and the second electrode CTD in the connection portion CT directly flows from the charge generation layer CGL to the second electrode CTD without passing through the second stack S2. Therefore, the current does not pass through the second stack S2, which is a major cause of luminance change due to temperature change, in the connection portion CT of the non-light emitting portion, thereby reducing the resistance and thus generating a level of current with only a single stack through the first electrode ANDR, ANDG, and ANDB and the second electrode CTD. Accordingly, the light emitting display device having a tandem structure including a connection portion between the charge generation layer and the second electrode in the non-light emitting portion can reduce a change in luminance when the temperature changes, such that the change in luminance is the same as or substantially similar to the level luminance change experienced by a single stack light emitting display device.

In addition, the light emitting display device according to the second embodiment of the present disclosure has a configuration in which the connection portion CT is provided in the non-light emitting portion around the green light emitting portion GE, the second hole transport layer HTL2 and the second electron transport layer ETL2, which are common layers of the second stack S2, are disconnected from the green light emitting portion GE at a portion facing the adjacent light emitting portion, thereby reducing or preventing lateral leakage current flowing between the green light emitting portion GE and the red light emitting portion RE and between the green light emitting portion GE and the blue light emitting portion BE. Accordingly, when the light emitting portion of a specific color is turned on, a phenomenon in which light emitting portions of other colors emit light due to lateral leakage current can be prevented or reduced.

In the plan view of FIG. 12 illustrating the light emitting display device according to the second embodiment of the present disclosure, arrangements of the red light emitting portion, the green light emitting portion, and the blue light emitting portion are the same as those of FIG. 5, and description thereof is omitted.

However, the light emitting display device according to the second embodiment of the present disclosure is not limited to the arrangement shown in FIG. 12, and the red light emitting portion, the green light emitting portion, and the blue light emitting portion are arranged in the form of a stripe, or one red light emitting portion and one green light emitting portion are arranged in a first direction, and one red light emitting portion and one blue light emitting portion adjacent to the green light emitting portion are arranged adjacent to each other in parallel to the first direction. In addition to the arrangement of various red, green, and blue light emitting portions, a connection portion CT between the second electrode and the charge generation layer can be provided around the green light emitting portion.

Figure 14:
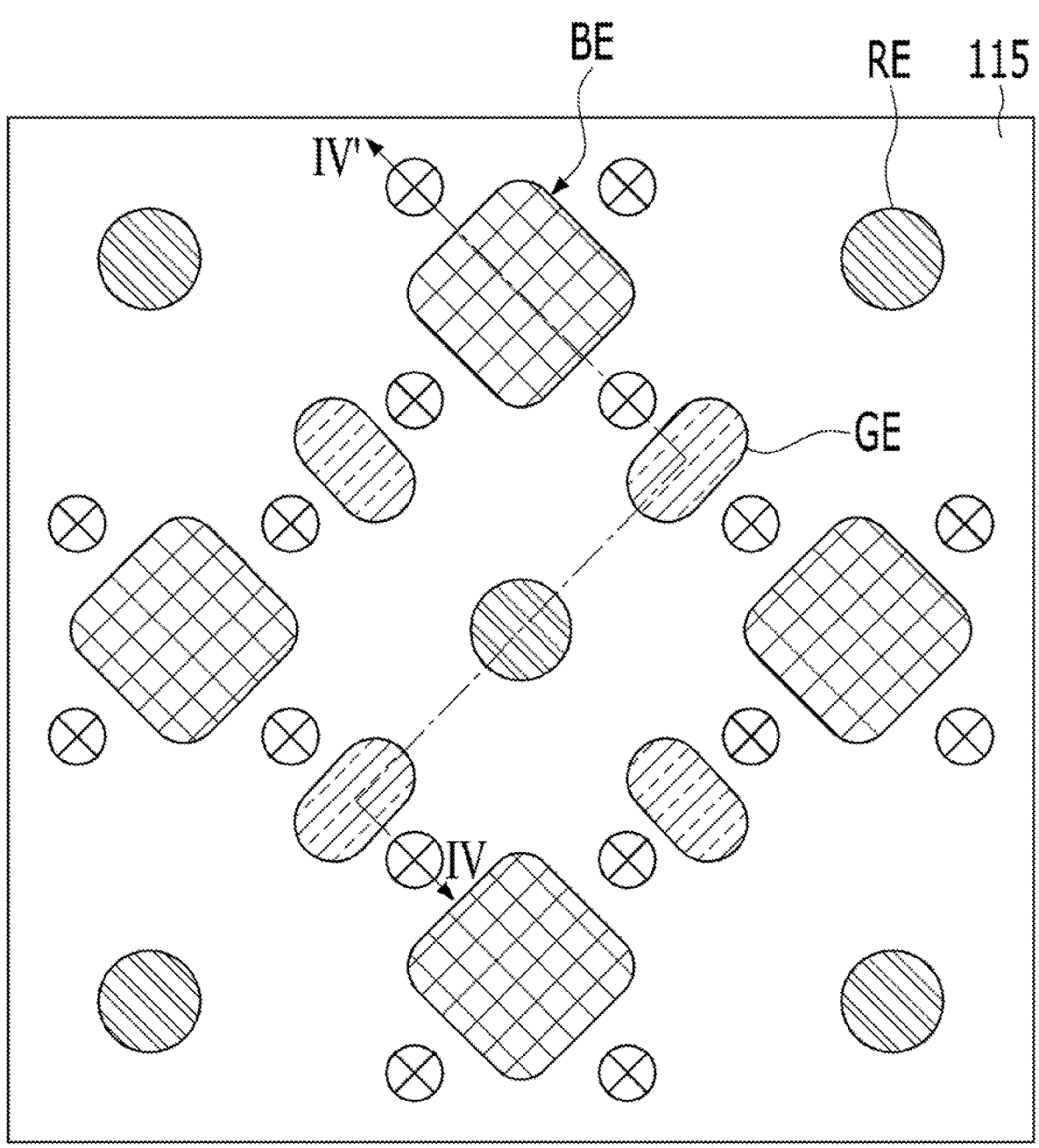
FIG. 14 is a plan view illustrating a light emitting display device according to another embodiment of the present disclosure.
Figure 15:
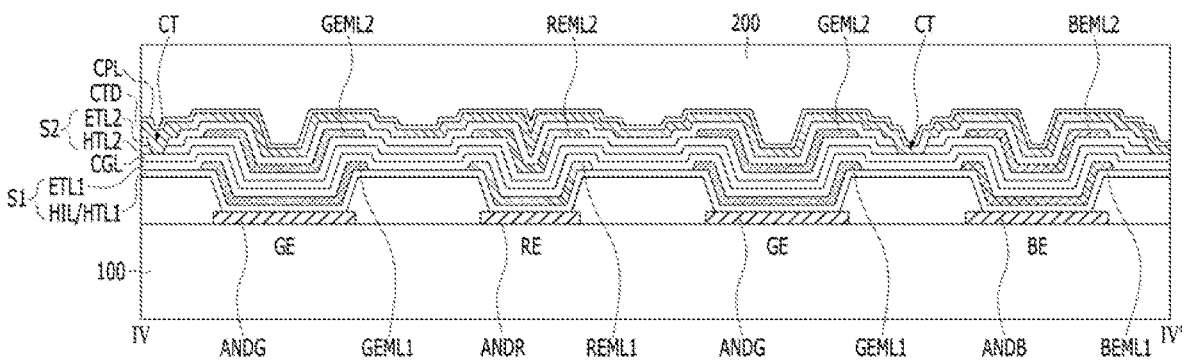
FIG. 15 is a cross-sectional view taken along line IV-IV' of FIG. 14 according to an embodiment of the present disclosure.

FIG. 14 is a plan view illustrating a light emitting display device according to a third embodiment of the present disclosure, and FIG. 15 is a cross-sectional view taken along IV-IV' of FIG. 14.

As shown in FIGS. 14 and 15, the light emitting display device according to the third embodiment of the present disclosure has a configuration in which the connection portion CT is provided in the non-light emitting portion around the blue light emitting portion BE, and the second hole transport layer HTL2 and the second electron transport layer ETL2, which are common layers of the second stack S2, are disconnected from the blue light emitting portion BE at a portion facing the adjacent light emitting portion, thereby reducing or preventing a lateral leakage current flowing between the blue light emitting portion BE and the red light emitting portion RE and between the blue light emitting portion BE and the green light emitting portion GE. For example, connection portions CT can be disposed between the blue light emitting portions BE and the green light emitting portions GE. Also, connection portions CT can be disposed on all sides of each green light emitting portion GE.

In addition, by providing a connection portion CT connecting the charge generation layer CGL as a common layer to the second electrode CTD, lateral leakage current due to the common layers HTL2 and ETL2 in the second stack S2 can be prevented.

Therefore, the light emitting display device according to the third embodiment of the present disclosure includes a connection portion CT between a blue light emitting portion BE and the non-light emitting portion spaced apart from the adjacent blue light emitting portion BE, so that even if the turn-on voltage of the red light emitting portion is lower than the turn-on voltage of each of the blue light emitting portion and the green light emitting portion, when the blue light emitting portion is selectively turned on or the green light emitting portion is selectively turned on, a phenomenon in which the adjacent red light emitting portion is turned on can be prevented. That is, when the blue light emitting portion BE and the other color light emitting portions RE and GE are turned on, generation of leakage light other than the blue light can be prevented.

The portions of the second stack S2 are removed from the connection portion CT, so that the second hole transport layer HTL2 and the second electron transport layer ETL2 of the second stack S2 can be side-connected to the second electrode CTD and a part of the top of the charge generation layer CGL exposed at the connection portion CT can be directly connected to the second electrode CTD. The light emitting display device according to the third embodiment of the present disclosure has a configuration in which the charge generation layer CGL and the second electrode CTD disposed thereon and thereunder, respectively, are connected to each other in the connection portion CT in the non-light emitting portion so that the current flowing between the first electrodes ANDR, ANDG, and ANDB and the second electrode CTD in the connection portion CT directly flows from the charge generation layer CGL to the second electrode CTD without passing through the second stack S2. Therefore, the current does not pass through the second stack S2, which is a major cause of luminance change due to temperature change, in the connection portion CT of the non-light emitting portion, thereby reducing the resistance and thus generating a level of current with only a single stack through the first electrodes ANDR, ANDG, and ANDB and the second electrode CTD. Accordingly, the light emitting display device having a tandem structure having a connection portion between the charge generation layer and the second electrode in the non-light emitting portion can reduce a change in luminance when the temperature changes so that it is equal to or substantially similar to the amount of luminance change experienced by that of a single stack light emitting display device.

In addition, the light emitting display device according to the third embodiment of the present disclosure has a configuration in which the connection portion CT is provided in the non-light emitting portion around the blue light emitting portion BE, the second hole transport layer HTL2 and the second electron transport layer ETL2, which are common layers of the second stack S2, are disconnected from the blue light emitting portion BE at a portion facing the adjacent light emitting portion, thereby reducing or preventing lateral leakage current flowing between the blue light emitting portion BE and the red light emitting portion RE and between the blue light emitting portion BE and the green light emitting portion GE. Accordingly, when the light emitting portion of a specific color is turned on, a phenomenon in which light emitting portions of other colors emit light due to lateral leakage current can be prevented.

In the plan view of FIG. 14 illustrating the light emitting display device according to the third embodiment of the present disclosure, arrangements of the red light emitting portion, the green light emitting portion, and the blue light emitting portion are the same as those of FIG. 5, and description thereof is omitted.

However, the light emitting display device according to the third embodiment of the present disclosure is not limited to the arrangement shown in FIG. 14, and the red light emitting portion, the green light emitting portion, and the blue light emitting portion are arranged in the form of a stripe, or one red light emitting portion and one green light emitting portion are arranged in a first direction, and one red light emitting portion and one blue light emitting portion adjacent to the green light emitting portion are arranged adjacent to each other in parallel to the first direction. In addition to the arrangement of various red, green, and blue light emitting portions, a connection portion CT between the second electrode and the charge generation layer can be provided around the green light emitting portion.

As shown in FIGS. 6, 13 and 15, in the light emitting display device of the present disclosure, the red light emitting element includes at least a first electrode ANDR provided on the substrate 100 corresponding to the red light emitting portion RE, at least two first and second stacks S1 and S2 on the first electrode ANDR, a charge generation layer CGL between the first and second stacks S1 and S2, and a second electrode CTD on the second stack S2.

Similarly, the green light emitting element includes at least a first electrode ANDG provided on the substrate 100 corresponding to the green light emitting portion GE, at least two first and second stacks S1 and S2 on the first electrode ANDG, a charge generation layer CGL between the first and second stacks S1 and S2, and a second electrode CTD on the second stack S2.

In addition, the blue light emitting element includes at least a first electrode ANDB provided on the substrate 100 corresponding to the blue light emitting portion BE, at least two first and second stacks S1 and S2 on the first electrode ANDB, a charge generation layer CGL between the first and second stacks S1 and S2, and a second electrode CTD on the second stack S2.

The light emitting display device of the present disclosure can be applied not only to the arrangement of red, green, and blue light emitting portions described in the first to third embodiments, but also to light emitting display devices to implement white light based on other combinations. For example, cyan, magenta, and yellow light emitting portions can have a stripe, pentile, or diagonal arrangement, and light emitting layers of the same color can overlap in different stacks in each light emitting portion. A connection portion between the second electrode (cathode) and the charge generation layer is provided in the non-light emitting portion between the light emitting portions emitting light of different colors, to prevent low-gradation light leakage due to lateral leakage current in the light emitting display device described above, and to prevent or reduce luminance change upon temperature changes in a multi-stack structure by blocking or reducing the effect of the resistance of the second stack.

Figure 16:
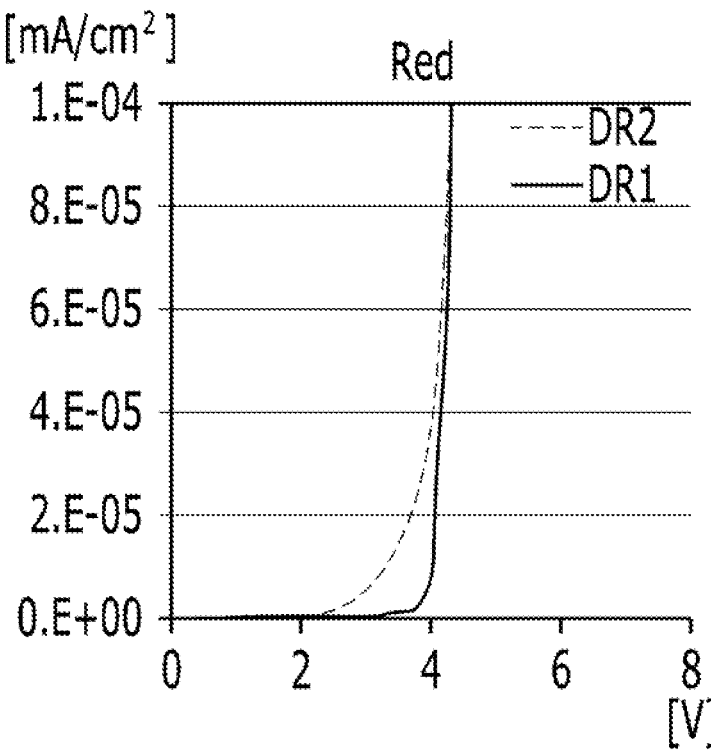
FIG. 16 is a graph illustrating comparison in I-V characteristics when a red light emitting device having a tandem structure is applied to the first and second experimental examples according to embodiments of the present disclosure.
Figure 17:
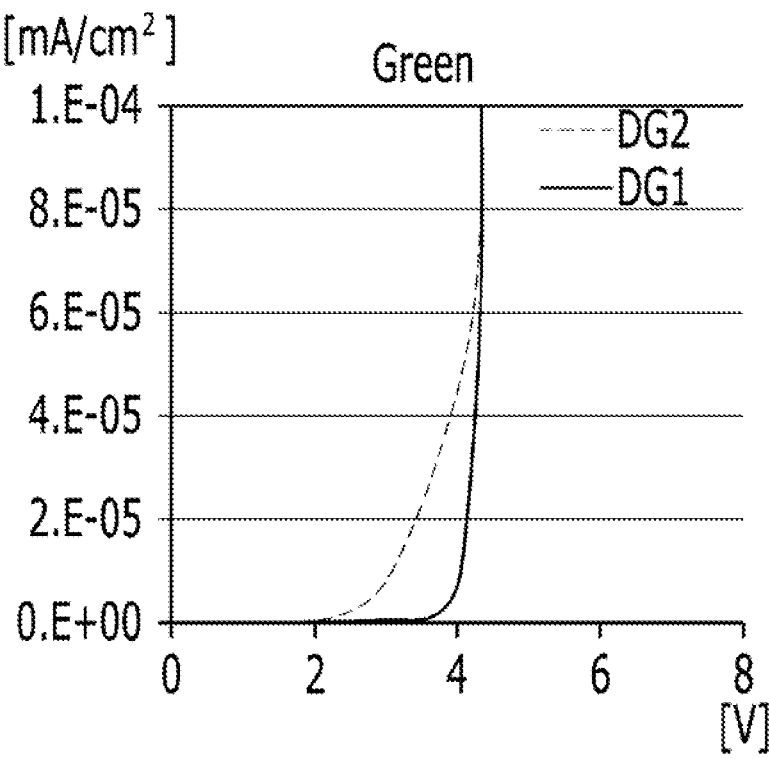
FIG. 17 is a graph illustrating comparison in I-V characteristics when a green light emitting device having a tandem structure is applied to the first and second experimental examples according to embodiments of the present disclosure.
Figure 18:
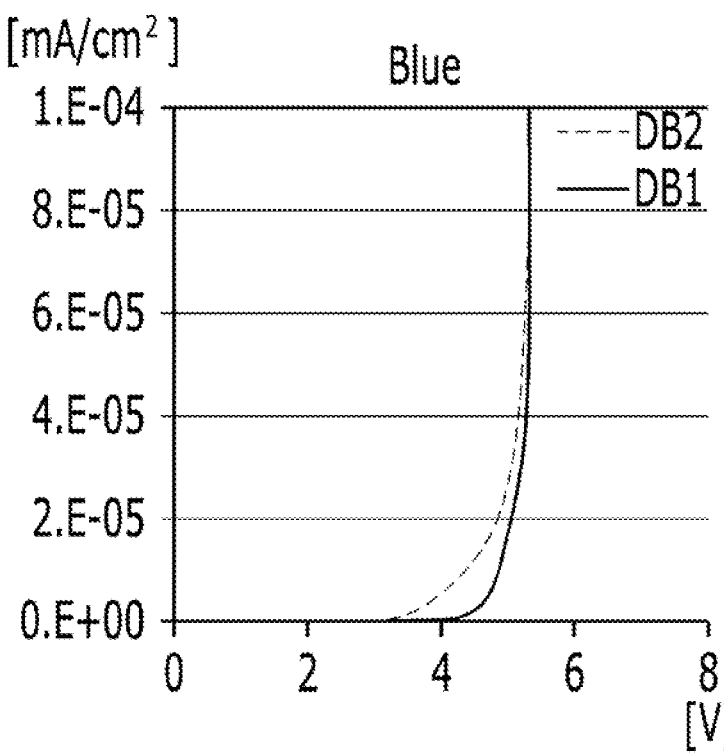
FIG. 18 is a graph illustrating comparison in I-V characteristics when a blue light emitting device having a tandem structure is applied to the first and second experimental examples according to embodiments of the present disclosure.

FIG. 16 is a graph illustrating comparison in I-V characteristics when a red light emitting device having a tandem structure is applied to the first and second experimental examples according to embodiments of the present disclosure, FIG. 17 is a graph illustrating comparison in I-V characteristics when a green light emitting device having a tandem structure is applied to the first and second experimental examples according to embodiments of the present disclosure, and FIG. 18 is a graph illustrating comparison in I-V characteristics when a blue light emitting device having a tandem structure is applied to the first and second experimental examples according to embodiments of the present disclosure.

As shown in FIGS. 16 to 18, the red light emitting element, the green light emitting element, and the blue light emitting element having a tandem structure including two or more stacks, as in the second experimental example (DR2, DG2, DB2), include a connection through the connection portion between the second electrode and the charge generation layer between the stacks, thereby having the effects of removing the effect of resistance due to the stack between the connected second electrodes, preventing a decrease in the current supplied to the second electrode and thus a decrease in current caused by an increase in resistance, improving I-V curve characteristics, and reducing the turn-on voltage compared to the first experimental example (DR1, DG1, DB1) having no connection.

As apparent from the foregoing, the light emitting display device of the present disclosure has the following effects.

First, a connection between a common layer in an organic stack between an anode and a cathode, and the cathode is provided in a non-light emitting portion between light emitting portions, so that an increase in resistance due to an increase in the number of organic stacks can be prevented. In a tandem structure having an increased number of stacks, an increase in resistance caused by an increase in the common layer can be prevented and thus a decrease in current can be prevented. Therefore, by supplying the same current as the current flowing through the first stack to the second electrode, a change in luminance due to a temperature change can be blocked or prevented.

Second, a predetermined potential is supplied to the common layer of adjacent sub-pixels in the non-light emitting portion between adjacent light emitting portions through the connection portion, so that generation of leakage current due to any turn-on voltage differences between different light emitting portions can be prevented. In the connection portion, the second stack forms a vertical path with the charge generation layer disposed thereunder and the second electrode, and one or more portions of the common layer is removed to prevent lateral leakage current between adjacent light emitting portions for emitting light of other colors, and to effectively prevent low-gradation light leakage.

In the present disclosure, an internal stack on the bank is changed without adding any material so that it effectively prevents lateral leakage current between adjacent light emitting portions. Finally, the Environmental, Social, and Governance (ESG) effect and advantages can be acquired in terms of eco-friendly, low power consumption and process optimization advantages.

A light emitting display device according to the present disclosure can include a substrate having a plurality of light emitting portions and a non-light emitting portion between the light emitting portions, first electrodes at the respective light emitting portions and spaced apart from each other, a first stack, a first charge generation layer and a second stack on the first electrodes, the first charge generation layer positioned between the first stack and the second stack and a second electrode on the second stack, the second electrode electrically connected through a connection portion to the first charge generation layer at the non-light emitting portion.

In a light emitting display device according to one or more aspects of the present disclosure, each of the first stack and the second stack can include a hole transport layer, a light emitting layer, and an electron transport layer. The connection portion can pass through the hole transport layer and the electron transport layer of the second stack. Also, the second electrode can be directly connected to the first charge generation layer through the connection portion.

A light emitting display device according to one or more aspects of the present disclosure can further include a bank at the non-light emitting portion. The bank can cover an edge of the first electrode. On the bank, the second stack can be removed at the connection portion.

In a light emitting display device according to one or more aspects of the present disclosure, a common layer of the second stack is in contact with a side surface of the second electrode at the connection portion.

In a light emitting display device according to one or more aspects of the present disclosure, the common layer of the second stack includes a first common layer below a light emitting layer of the second stack and a second common layer above the light emitting layer of the second stack.

In a light emitting display device according to one or more aspects of the present disclosure, the light emitting layer has an edge spaced apart from the connection portion.

A light emitting display device according to one or more aspects of the present disclosure can further include at least one stack between the first charge generation layer and the second stack and a second charge generation layer between the at least one stack and the second stack.

In a light emitting display device according to one or more aspects of the present disclosure, the connection portion between the second electrode and the first charge generation layer can be present in the form of an island between adjacent light emitting portions.

In a light emitting display device according to one or more aspects of the present disclosure, the connection portion between the second electrode and the first charge generation layer can be present in the form of a closed loop surrounding one light emitting portion.

A light emitting display device according to one or more aspects of the present disclosure can include a substrate including a first light emitting portion and a second light emitting portion spaced apart from the first light emitting portion, a first anode and a second anode at the first light emitting portion and the second light emitting portion, respectively, a first stack, a charge generation layer and a second stack provided on the first anode and the second anode, a cathode on the second stack, and a connection portion connecting the cathode to the charge generation layer between the first light emitting portion and the second light emitting portion.

A light emitting display device according to one or more aspects of the present disclosure can further include a bank between the first light emitting portion and the second light emitting portion. The bank can cover an edge of each of the first anode and the second anode, and on the bank, the second stack is removed at the connection portion.

In a light emitting display device according to one or more aspects of the present disclosure, the connection portion can be present in the form of an island spaced from each of the first light emitting portion and the second light emitting portion.

In a light emitting display device according to one or more aspects of the present disclosure, the connection portion between the cathode and the charge generation layer can be present in the form of a closed loop surrounding one light emitting portion.

In a light emitting display device according to one or more aspects of the present disclosure, the first light emitting portion can include a first light emitting layer emitting light of a first color in each of the first stack and the second stack, and the second light emitting portion includes a second light emitting layer emitting light of a second color different from the first color in each of the first stack and the second stack.

In a light emitting display device according to one or more aspects of the present disclosure, the first light emitting layer and the second light emitting layer can be spaced apart from the connection portion.

A light emitting display device according to one or more aspects of the present disclosure, can further include, over the first light emitting portion, the second light emitting portion and an area between the first and second light emitting portions on the substrate, a first common layer disposed below the first light emitting layer and the second light emitting layer and a second common layer disposed above the first light emitting layer and the second light emitting layer.

In a light emitting display device according to one or more aspects of the present disclosure, the first common layer and the second common layer of the second stack can be removed at the connection portion. And the cathode can be directly connected to the charge generation layer through the connection portion.

In a light emitting display device according to one or more aspects of the present disclosure, at least one of the first common layer and the second common layer of the second stack can be in contact with a side surface of the cathode at the connection portion.

It will be apparent to those skilled in the art that various modifications and variations can be made in the disclosure without departing from the spirit or scope of the disclosure. Thus, it is intended that the disclosure covers such modifications and variations thereof, provided they fall within the scope of the appended claims and their equivalents.

What is claimed is:

1. A light emitting display device comprising:
a plurality of light emitting portions disposed on a substrate and a non-light emitting portion between the light emitting portions;

first electrodes respectively disposed at the plurality of light emitting portions, the first electrodes being spaced apart from each other;

a first stack, a first charge generation layer and a second stack disposed on the first electrodes, the first charge generation layer being disposed between the first stack and the second stack and the first charge generation layer extending continuously across two adjacent light emitting portions among the plurality of light emitting portions; and a second electrode disposed on the second stack, the second electrode being electrically connected to the first charge generation layer through a connection portion at the non-light emitting portion where the first charge generation layer extends continuously across the two adjacent light emitting portions.

2. The light emitting display device according to claim 1, wherein the second electrode directly contacts the first charge generation layer.

3. The light emitting display device according to claim 1, wherein each of the first stack and the second stack includes a hole transport layer, a light emitting layer, and an electron transport layer, wherein the connection portion passes through both of the hole transport layer and the electron transport layer of the second stack, and wherein the second electrode is directly connected to the first charge generation layer through the connection portion.

4. The light emitting display device according to claim 1, further comprising a bank disposed at the non-light emitting portion, wherein the bank covers an edge of each of the first electrodes, and wherein a portion of the second stack is removed at an area overlapping with the bank for forming the connection portion.

5. The light emitting display device according to claim 1, wherein a common layer of the second stack is in direct contact with a side surface of the second electrode at the connection portion.

6. The light emitting display device according to claim 5, wherein the common layer of the second stack includes:

a first common layer; and a second common layer on the first common layer, wherein a light emitting layer of the second stack is disposed between the first common layer and the second common layer of the second stack.

7. The light emitting display device according to claim 1, wherein an edge of a light emitting layer in the second stack is spaced apart from the connection portion.

8. The light emitting display device according to claim 1, further comprising:

at least one stack disposed between the first charge generation layer and the second stack; and a second charge generation layer disposed between the at least one stack and the second stack.

9. The light emitting display device according to claim 1, wherein the connection portion between the second electrode and the first charge generation layer has an island shape in an area between adjacent light emitting portions in a plan view.

10. The light emitting display device according to claim 1, wherein the connection portion between the second electrode and the first charge generation layer has a closed loop shape surrounding one light emitting portion among the plurality of light emitting portions in a plan view.

11. A light emitting display device comprising:

a first light emitting portion and a second light emitting portion disposed on a substrate, the second light emitting portion being spaced apart from the first light emitting portion;

a first anode disposed at the first light emitting portion;

a second anode disposed at the second light emitting portion;

a first stack, a charge generation layer and a second stack disposed on the first anode and the second anode, wherein the charge generation layer extends continuously across the first light emitting portion and the second light emitting portion;

a cathode disposed on the second stack; and a connection portion disposed between the first light emitting portion and the second light emitting portion, the connection portion electrically connecting the cathode with the charge generation layer in a non-light emitting portion where the charge generation layer extends continuously across the first light emitting portion and the second light emitting portion.

12. The light emitting display device according to claim 11, further comprising a bank disposed between the first light emitting portion and the second light emitting portion, wherein the bank covers an edge of the first anode and an edge of the second anode, and wherein a portion of the second stack is removed at the connection portion in an area overlapping with the bank or the second stack includes a hole overlapping with a portion of the bank.

13. The light emitting display device according to claim 11, wherein the connection portion has an island shape spaced apart from each of the first light emitting portion and the second light emitting portion in a plan view.

14. The light emitting display device according to claim 11, wherein the connection portion between the cathode and the charge generation layer has a closed loop shape surrounding one light emitting portion among the first light emitting portion and the second light emitting portion in a plan view.

15. The light emitting display device according to claim 11, wherein each of the first stack and the second stack in the first light emitting portion includes a first light emitting layer configured to emit light of a first color, and wherein each of the first stack and the second stack in the second light emitting portion includes a second light emitting layer configured to emit light of a second color different from the first color.

16. The light emitting display device according to claim 15, wherein the first light emitting layer and the second light emitting layer are spaced apart from the connection portion.

17. The light emitting display device according to claim 15, further comprising:

a first common layer disposed below the first light emitting layer and the second light emitting layer; and a second common layer disposed above the first light emitting layer and the second light emitting layer.

18. The light emitting display device according to claim 17, wherein portions of the first common layer and the second common layer of the second stack are removed at the connection portion or a hole extends through the first common layer and the second common layer at the connection portion, and wherein the cathode is directly connected to the charge generation layer through the connection portion.

19. The light emitting display device according to claim 18, wherein at least one of the first common layer and the second common layer of the second stack is in contact with a side surface of the cathode at the connection portion.

20. A light emitting display device comprising:

a first sub-pixel and a second sub-pixel disposed on a substrate;

a first-first light emitting layer and a first-second light emitting layer disposed in the first sub-pixel;

a second-first light emitting layer and a second-second light emitting layer disposed in the second sub-pixel; and a common layer disposed between the first-first light emitting layer and the first-second light emitting layer in the first sub-pixel, and disposed between the second-first light emitting layer and the second-second light emitting layer in the second sub-pixel, wherein the common layer extends continuously across the first sub-pixel and the second sub-pixel, and wherein a cathode of at least one of the first sub-pixel and the second sub-pixel directly contacts the common layer in an area between the first sub-pixel and the second sub-pixel where the common layer extends continuously across the first sub-pixel and the second sub-pixel.

\* \* \* \* \*